(12) United States Patent
Donovan et al.

(10) Patent No.: US 11,846,728 B2
(45) Date of Patent: Dec. 19, 2023

(54) EYE-SAFE LONG-RANGE LIDAR SYSTEM USING ACTUATOR

(71) Applicant: OPSYS Tech Ltd., Holon (IL)

(72) Inventors: Mark J. Donovan, Mountain View, CA (US); Larry Fabiny, Boulder, CO (US)

(73) Assignee: OPSYS Tech Ltd., Holon (IL)

( * ) Notice: Subject to any disclaimer, the term of this patent is extended or adjusted under 35 U.S.C. 154(b) by 347 days.

(21) Appl. No.: 16/878,140

(22) Filed: May 19, 2020

(65) Prior Publication Data

US 2020/0379088 A1 Dec. 3, 2020

Related U.S. Application Data

(60) Provisional application No. 62/854,782, filed on May 30, 2019.

(51) Int. Cl.
*G01S 7/481* (2006.01)
*H01S 5/183* (2006.01)
(Continued)

(52) U.S. Cl.
CPC .......... *G01S 7/4815* (2013.01); *G01S 7/4816* (2013.01); *G01S 7/4817* (2013.01); *G01S 7/4863* (2013.01);
(Continued)

(58) Field of Classification Search
CPC .... G01S 7/4815; G01S 7/4816; G01S 7/4863; G01S 7/4817; G01S 17/10; G01S 17/42;
(Continued)

(56) References Cited

U.S. PATENT DOCUMENTS

| | | |
|---|---|---|
| 5,157,257 A | 10/1992 | Geiger |
| 5,552,893 A | 9/1996 | Akasu |

(Continued)

FOREIGN PATENT DOCUMENTS

| | | |
|---|---|---|
| CN | 1512946 A | 7/2004 |
| CN | 101013030 A | 8/2007 |

(Continued)

OTHER PUBLICATIONS

"Written Opinion of the International Searching Authority" for International Patent Application No. PCT/EP2016/077499, dated Feb. 14, 2017, 7 pages, The International Searching Authority.

(Continued)

*Primary Examiner* — Jennifer D Bennett
*Assistant Examiner* — Erin R Garber
(74) *Attorney, Agent, or Firm* — Rauschenbach Patent Law Group, PLLC; Kurt Rauschenbach

(57) ABSTRACT

A LIDAR system includes a plurality of lasers that generate an optical beam having a FOV. A plurality of detectors are positioned where a FOV of at least one of the plurality of optical beams generated by the plurality of lasers overlaps a FOV of at least two of the plurality of detectors. The lens system collimates and projects the optical beams generated by the plurality of lasers. An actuator is coupled to at least one of the plurality of lasers and the lens system to cause relative motion between the plurality of lasers and the lens system in a direction that is orthogonal to an optical axis of the lens system so as to cause relative motion between the FOVs of the optical beams generated by the plurality of lasers and the FOVs of the detectors.

32 Claims, 13 Drawing Sheets

(51) Int. Cl.

| | | |
|---|---|---|
| *G01S 7/4863* | (2020.01) | |
| *G01S 17/10* | (2020.01) | |
| *G01S 17/931* | (2020.01) | |
| *G01S 17/894* | (2020.01) | |
| *H01S 5/00* | (2006.01) | |
| *G01J 1/04* | (2006.01) | |
| *G01S 17/42* | (2006.01) | |
| *G01S 17/00* | (2020.01) | |

(52) U.S. Cl.
CPC ............ *G01S 17/10* (2013.01); *G01S 17/894* (2020.01); *G01S 17/931* (2020.01); *H01S 5/18388* (2013.01); *G01J 1/0448* (2013.01); *G01S 7/481* (2013.01); *G01S 17/003* (2013.01); *G01S 17/42* (2013.01); *H01S 5/005* (2013.01)

(58) Field of Classification Search
CPC ...... G01S 17/931; G01S 17/894; G01S 7/481; G01S 17/003; G01S 17/89; G01S 7/4808; G01S 7/486; H01S 5/18388; H01S 5/005; H01S 5/423
See application file for complete search history.

(56) References Cited

U.S. PATENT DOCUMENTS

| | | |
|---|---|---|
| 5,909,296 A | 6/1999 | Tsacoyeanes |
| 6,057,909 A | 5/2000 | Yahav et al. |
| 6,061,001 A | 5/2000 | Sugimoto |
| 6,246,708 B1 | 6/2001 | Thornton et al. |
| 6,353,502 B1 | 3/2002 | Marchant et al. |
| 6,680,788 B1 | 1/2004 | Roberson et al. |
| 6,717,972 B2 | 4/2004 | Steinle et al. |
| 6,775,480 B1 | 8/2004 | Goodwill |
| 6,788,715 B1 | 9/2004 | Leeuwen et al. |
| 6,829,439 B1 | 12/2004 | Sidorovich et al. |
| 6,860,350 B2 | 3/2005 | Beuhler et al. |
| 6,888,871 B1 | 5/2005 | Zhang et al. |
| 7,065,112 B2 | 6/2006 | Ghosh et al. |
| 7,110,183 B2 | 9/2006 | von Freyhold et al. |
| 7,544,945 B2 | 6/2009 | Tan et al. |
| 7,652,752 B2 | 1/2010 | Fetzer et al. |
| 7,702,191 B1 | 4/2010 | Geron et al. |
| 7,746,450 B2 | 6/2010 | Willner et al. |
| 7,773,204 B1 | 8/2010 | Nelson |
| 7,969,558 B2 | 6/2011 | Hall |
| 8,072,581 B1 | 12/2011 | Breiholz |
| 8,115,909 B2 | 2/2012 | Behringer et al. |
| 8,247,252 B2 | 8/2012 | Gauggel et al. |
| 8,301,027 B2 | 10/2012 | Shaw et al. |
| 8,576,885 B2 | 11/2013 | van Leeuwen et al. |
| 8,675,181 B2 | 3/2014 | Hall |
| 8,675,706 B2 | 3/2014 | Seurin et al. |
| 8,783,893 B1 | 7/2014 | Seurin et al. |
| 8,824,519 B1 | 9/2014 | Seurin et al. |
| 9,038,883 B2 | 5/2015 | Wang et al. |
| 9,048,633 B2 | 6/2015 | Gronenborn et al. |
| 9,268,012 B2 | 2/2016 | Ghosh et al. |
| 9,285,477 B1 | 3/2016 | Smith et al. |
| 9,348,018 B2 | 5/2016 | Eisele et al. |
| 9,360,554 B2 | 6/2016 | Retterath et al. |
| 9,378,640 B2 | 6/2016 | Mimeault et al. |
| 9,392,259 B2 | 7/2016 | Borowski |
| 9,516,244 B2 | 12/2016 | Borowski |
| 9,520,696 B2 | 12/2016 | Wang et al. |
| 9,553,423 B2 | 1/2017 | Chen et al. |
| 9,560,339 B2 | 1/2017 | Borowski |
| 9,574,541 B2 | 2/2017 | Ghosh et al. |
| 9,575,184 B2 | 2/2017 | Gilliland et al. |
| 9,658,322 B2 | 5/2017 | Lewis |
| 9,674,415 B2 | 6/2017 | Wan et al. |
| 9,791,557 B1 | 10/2017 | Wyrwas et al. |
| 9,841,495 B2 | 12/2017 | Campbell et al. |
| 9,857,468 B1 | 1/2018 | Eichenholz et al. |
| 9,933,513 B2 | 4/2018 | Dussan et al. |
| 9,946,089 B2 | 4/2018 | Chen et al. |
| 9,989,406 B2 | 6/2018 | Pacala et al. |
| 9,989,629 B1 | 6/2018 | LaChapelle |
| 9,992,477 B2 | 6/2018 | Pacala et al. |
| 10,007,001 B1 | 6/2018 | LaChapelle et al. |
| 10,063,849 B2 | 8/2018 | Pacala et al. |
| 10,191,156 B2 | 1/2019 | Steinberg et al. |
| 10,295,660 B1 * | 5/2019 | McMichael ............ G02B 7/005 |
| 10,488,492 B2 | 11/2019 | Hamel et al. |
| 10,514,444 B2 | 12/2019 | Donovan |
| 10,761,195 B2 | 9/2020 | Donovan |
| 10,928,486 B2 | 2/2021 | Donovan |
| 11,016,178 B2 | 5/2021 | Donovan |
| 11,061,234 B1 * | 7/2021 | Zhu ........................ G01S 17/10 |
| 11,320,538 B2 | 5/2022 | Donovan et al. |
| 2002/0117340 A1 | 8/2002 | Stettner |
| 2002/0195496 A1 | 12/2002 | Tsikos et al. |
| 2003/0043363 A1 | 3/2003 | Jamieson et al. |
| 2003/0147652 A1 | 8/2003 | Green et al. |
| 2004/0120717 A1 | 6/2004 | Clark et al. |
| 2004/0228375 A1 | 11/2004 | Ghosh et al. |
| 2005/0025211 A1 | 2/2005 | Zhang et al. |
| 2005/0180473 A1 | 8/2005 | Brosnan |
| 2005/0232628 A1 | 10/2005 | von Freyhold et al. |
| 2006/0132752 A1 | 6/2006 | Kane |
| 2006/0231771 A1 | 10/2006 | Lee et al. |
| 2006/0244978 A1 | 11/2006 | Yamada et al. |
| 2007/0024849 A1 | 2/2007 | Carrig et al. |
| 2007/0071056 A1 | 3/2007 | Chen |
| 2007/0091960 A1 | 4/2007 | Gauggel et al. |
| 2007/0131842 A1 | 6/2007 | Erst |
| 2007/0177841 A1 | 8/2007 | Dazinger |
| 2007/0181810 A1 | 8/2007 | Tan et al. |
| 2007/0219720 A1 | 9/2007 | Trepagnier et al. |
| 2008/0074640 A1 | 3/2008 | Walsh et al. |
| 2008/0186470 A1 | 8/2008 | Hipp |
| 2009/0027651 A1 | 1/2009 | Pack et al. |
| 2009/0140047 A1 | 6/2009 | Yu et al. |
| 2009/0161710 A1 | 6/2009 | Hoashi et al. |
| 2009/0273770 A1 | 11/2009 | Bauhahn et al. |
| 2009/0295986 A1 * | 12/2009 | Topliss ................... F03G 7/065 348/374 |
| 2010/0046953 A1 | 2/2010 | Shaw et al. |
| 2010/0215066 A1 | 8/2010 | Mordaunt et al. |
| 2010/0271614 A1 | 10/2010 | Alburquerque et al. |
| 2010/0302528 A1 | 12/2010 | Hall |
| 2011/0176567 A1 | 7/2011 | Joseph |
| 2011/0216304 A1 * | 9/2011 | Hall ........................ G01S 17/89 356/4.01 |
| 2012/0038903 A1 | 2/2012 | Weimer et al. |
| 2013/0163626 A1 | 6/2013 | Seurin et al. |
| 2013/0163627 A1 | 6/2013 | Seurin et al. |
| 2013/0206967 A1 | 8/2013 | Shpunt et al. |
| 2013/0208256 A1 | 8/2013 | Mamidipudi et al. |
| 2013/0208753 A1 | 8/2013 | van Leeuwen et al. |
| 2014/0043309 A1 | 2/2014 | Go et al. |
| 2014/0049610 A1 | 2/2014 | Hudman et al. |
| 2014/0071427 A1 | 3/2014 | Last |
| 2014/0111812 A1 | 4/2014 | Baeg et al. |
| 2014/0139467 A1 | 5/2014 | Ghosh et al. |
| 2014/0160341 A1 | 6/2014 | Tickoo et al. |
| 2014/0218898 A1 | 8/2014 | Seurin et al. |
| 2014/0247841 A1 | 9/2014 | Seurin et al. |
| 2014/0267701 A1 | 9/2014 | Aviv et al. |
| 2014/0303829 A1 | 10/2014 | Lombrozo et al. |
| 2014/0312233 A1 | 10/2014 | Mark et al. |
| 2014/0333995 A1 | 11/2014 | Seurin et al. |
| 2014/0350836 A1 | 11/2014 | Stettner et al. |
| 2014/0376092 A1 | 12/2014 | Mor |
| 2015/0055117 A1 | 2/2015 | Pennecot et al. |
| 2015/0069113 A1 | 3/2015 | Wang et al. |
| 2015/0097947 A1 | 4/2015 | Tudman et al. |
| 2015/0103358 A1 | 4/2015 | Flascher |
| 2015/0109603 A1 | 4/2015 | Kim et al. |
| 2015/0123995 A1 | 5/2015 | Zavodny et al. |
| 2015/0131080 A1 | 5/2015 | Retterath et al. |
| 2015/0160341 A1 | 6/2015 | Akatsu et al. |

(56) References Cited

U.S. PATENT DOCUMENTS

| | | |
|---|---|---|
| 2015/0219764 A1 | 8/2015 | Lipson |
| 2015/0255955 A1 | 9/2015 | Wang et al. |
| 2015/0260830 A1 | 9/2015 | Ghosh et al. |
| 2015/0260843 A1 | 9/2015 | Lewis |
| 2015/0311673 A1 | 10/2015 | Wang et al. |
| 2015/0316368 A1 | 11/2015 | Moench et al. |
| 2015/0340841 A1 | 11/2015 | Joseph |
| 2015/0362585 A1 | 12/2015 | Ghosh et al. |
| 2015/0377696 A1 | 12/2015 | Shpunt et al. |
| 2015/0378023 A1 | 12/2015 | Royo Royo et al. |
| 2016/0003946 A1 | 1/2016 | Gilliland et al. |
| 2016/0006914 A1 | 1/2016 | Neumann |
| 2016/0025842 A1 | 1/2016 | Anderson et al. |
| 2016/0025993 A1 | 1/2016 | Mor et al. |
| 2016/0033642 A1 | 2/2016 | Fluckiger |
| 2016/0072258 A1 | 3/2016 | Seurin et al. |
| 2016/0080077 A1 | 3/2016 | Joseph et al. |
| 2016/0119611 A1 | 4/2016 | Hall et al. |
| 2016/0161600 A1 | 6/2016 | Eldada et al. |
| 2016/0254638 A1 | 9/2016 | Chen et al. |
| 2016/0259038 A1 | 9/2016 | Retterath et al. |
| 2016/0266242 A1 | 9/2016 | Gilliland et al. |
| 2016/0274223 A1 | 9/2016 | Imai |
| 2016/0282468 A1 | 9/2016 | Gruver et al. |
| 2016/0291156 A1 | 10/2016 | Hjelmstad |
| 2016/0306358 A1 | 10/2016 | Kang et al. |
| 2016/0335778 A1 | 11/2016 | Smits |
| 2016/0348636 A1 | 12/2016 | Ghosh et al. |
| 2017/0003392 A1 | 1/2017 | Bartlett et al. |
| 2017/0026633 A1 | 1/2017 | Riza |
| 2017/0059838 A1 | 3/2017 | Tilleman |
| 2017/0115497 A1 | 4/2017 | Chen et al. |
| 2017/0131387 A1 | 5/2017 | Campbell et al. |
| 2017/0131388 A1 | 5/2017 | Campbell et al. |
| 2017/0139041 A1 | 5/2017 | Drader et al. |
| 2017/0153319 A1 | 6/2017 | Villeneuve et al. |
| 2017/0168162 A1 | 6/2017 | Jungwirth |
| 2017/0176579 A1 | 6/2017 | Niclass et al. |
| 2017/0181810 A1 | 6/2017 | Tennican |
| 2017/0219426 A1 | 8/2017 | Pacala et al. |
| 2017/0256915 A1 | 9/2017 | Ghosh et al. |
| 2017/0269209 A1 | 9/2017 | Hall et al. |
| 2017/0285169 A1 | 10/2017 | Holz |
| 2017/0289524 A1 | 10/2017 | Pacala et al. |
| 2017/0299722 A1 | 10/2017 | Ouyang et al. |
| 2017/0307736 A1* | 10/2017 | Donovan ............. G01S 17/10 |
| 2017/0307758 A1 | 10/2017 | Pei et al. |
| 2017/0350982 A1 | 12/2017 | Lipson |
| 2017/0353004 A1 | 12/2017 | Chen et al. |
| 2017/0356740 A1 | 12/2017 | Ansari et al. |
| 2018/0045816 A1 | 2/2018 | Jarosinski et al. |
| 2018/0058923 A1 | 3/2018 | Lipson et al. |
| 2018/0059222 A1 | 3/2018 | Pacala et al. |
| 2018/0062345 A1* | 3/2018 | Bills ................. G01S 7/4815 |
| 2018/0068458 A1 | 3/2018 | Wan et al. |
| 2018/0074198 A1 | 3/2018 | Von Novak et al. |
| 2018/0107221 A1* | 4/2018 | Droz ................. G01S 7/4818 |
| 2018/0113200 A1 | 4/2018 | Steinberg et al. |
| 2018/0113208 A1 | 4/2018 | Bergeron et al. |
| 2018/0120441 A1 | 5/2018 | Elooz et al. |
| 2018/0128920 A1 | 5/2018 | Keilaf et al. |
| 2018/0136335 A1 | 5/2018 | Kare et al. |
| 2018/0152691 A1 | 5/2018 | Pacala et al. |
| 2018/0167602 A1 | 6/2018 | Pacala et al. |
| 2018/0180720 A1 | 6/2018 | Pei et al. |
| 2018/0180721 A1 | 6/2018 | Pei et al. |
| 2018/0180722 A1 | 6/2018 | Pei et al. |
| 2018/0203247 A1 | 7/2018 | Chen et al. |
| 2018/0209841 A1 | 7/2018 | Pacala et al. |
| 2018/0217236 A1 | 8/2018 | Pacala et al. |
| 2018/0259623 A1 | 9/2018 | Donovan |
| 2018/0259624 A1 | 9/2018 | Kiehn et al. |
| 2018/0259645 A1 | 9/2018 | Shu et al. |
| 2018/0269646 A1 | 9/2018 | Welford et al. |
| 2018/0275248 A1 | 9/2018 | Bailey et al. |
| 2018/0299552 A1 | 10/2018 | Shu et al. |
| 2018/0301872 A1 | 10/2018 | Burroughs et al. |
| 2018/0301874 A1 | 10/2018 | Burroughs et al. |
| 2018/0301875 A1 | 10/2018 | Burroughs et al. |
| 2018/0364334 A1 | 12/2018 | Xiang et al. |
| 2018/0364356 A1 | 12/2018 | Eichenholz et al. |
| 2019/0003429 A1 | 1/2019 | Miyashita |
| 2019/0004156 A1* | 1/2019 | Niclass ............... H01L 31/107 |
| 2019/0011561 A1 | 1/2019 | Pacala et al. |
| 2019/0011567 A1 | 1/2019 | Pacala et al. |
| 2019/0018115 A1 | 1/2019 | Schmitt et al. |
| 2019/0036308 A1 | 1/2019 | Carson et al. |
| 2019/0049662 A1 | 2/2019 | Thomsen et al. |
| 2019/0056497 A1 | 2/2019 | Pacala et al. |
| 2019/0094346 A1 | 3/2019 | Dumoulin et al. |
| 2019/0098233 A1 | 3/2019 | Gassend et al. |
| 2019/0137607 A1 | 5/2019 | Kostamovaara |
| 2019/0146071 A1 | 5/2019 | Donovan |
| 2019/0170855 A1 | 6/2019 | Keller et al. |
| 2019/0178974 A1 | 6/2019 | Droz |
| 2019/0179018 A1 | 6/2019 | Gunnam et al. |
| 2019/0293954 A1* | 9/2019 | Lin ..................... G02B 27/30 |
| 2019/0302246 A1 | 10/2019 | Donovan et al. |
| 2020/0018835 A1 | 1/2020 | Pei et al. |
| 2020/0041614 A1 | 2/2020 | Donovan et al. |
| 2020/0081101 A1 | 3/2020 | Donovan |
| 2020/0124732 A1* | 4/2020 | Sutherland ........... G01S 7/4813 |
| 2020/0200874 A1 | 6/2020 | Donovan |
| 2020/0209355 A1 | 7/2020 | Pacala et al. |
| 2020/0278426 A1 | 9/2020 | Dummer et al. |
| 2020/0326425 A1 | 10/2020 | Donovan et al. |
| 2020/0386868 A1 | 12/2020 | Donovan et al. |
| 2020/0408908 A1 | 12/2020 | Donovan |
| 2021/0033708 A1 | 2/2021 | Fabiny |
| 2021/0041567 A1 | 2/2021 | Milgrome et al. |
| 2021/0157000 A1 | 5/2021 | Imaki |
| 2021/0181311 A1 | 6/2021 | Donovan |
| 2021/0231779 A1 | 7/2021 | Donovan |
| 2021/0231806 A1 | 7/2021 | Donovan et al. |
| 2021/0234342 A1 | 7/2021 | Donovan |
| 2021/0278540 A1 | 9/2021 | Maayan et al. |
| 2021/0321080 A1* | 10/2021 | Jeong .................. G02B 27/30 |
| 2022/0146680 A1 | 5/2022 | Donovan et al. |

FOREIGN PATENT DOCUMENTS

| | | |
|---|---|---|
| CN | 101080733 A | 11/2007 |
| CN | 101545582 A | 9/2009 |
| CN | 103633557 A | 3/2014 |
| CN | 104898125 A | 9/2015 |
| CN | 105705964 A | 6/2016 |
| CN | 106464366 A | 2/2017 |
| CN | 109073757 A | 12/2018 |
| CN | 107728156 B | 11/2019 |
| CN | 110402398 A | 11/2019 |
| CN | 110914702 A | 3/2020 |
| CN | 111356934 A | 6/2020 |
| CN | 111919137 A | 11/2020 |
| CN | 112543875 A | 3/2021 |
| CN | 113692540 A | 11/2021 |
| CN | 113906316 A | 1/2022 |
| CN | 113924506 A | 1/2022 |
| CN | 114096882 A | 2/2022 |
| CN | 114174869 A | 3/2022 |
| DE | 197 17 399 A1 | 6/1999 |
| DE | 10103861 A1 | 8/2001 |
| DE | 102007004609 A1 | 8/2007 |
| DE | 102014216390 A1 | 2/2016 |
| DE | 102019005059 A1 | 2/2020 |
| EP | 1160540 A1 | 12/2001 |
| EP | 1444696 B1 | 3/2005 |
| EP | 1569007 A2 | 8/2005 |
| EP | 2656099 A1 | 12/2011 |
| EP | 2656106 A1 | 12/2011 |
| EP | 2775316 A2 | 9/2014 |
| EP | 3168641 B1 | 4/2016 |
| EP | 3497477 A1 | 8/2016 |
| EP | 2656100 A1 | 10/2016 |
| EP | 3526625 A1 | 11/2016 |

(56) References Cited

FOREIGN PATENT DOCUMENTS

| | | |
|---|---|---|
| EP | 3 159 711 A1 | 4/2017 |
| EP | 3446153 A2 | 2/2019 |
| EP | 3596492 A1 | 1/2020 |
| EP | 3658949 A1 | 6/2020 |
| EP | 3710855 A2 | 9/2020 |
| EP | 3775979 A1 | 2/2021 |
| EP | 3830602 A1 | 6/2021 |
| EP | 3953727 A1 | 2/2022 |
| EP | 3977159 A1 | 4/2022 |
| EP | 3980808 A1 | 4/2022 |
| EP | 3990943 A1 | 5/2022 |
| EP | 4004587 A1 | 6/2022 |
| FR | 2816264 A1 | 5/2002 |
| JP | 5-243552 A | 9/1993 |
| JP | 7-253460 | 10/1995 |
| JP | 8-280173 A | 10/1996 |
| JP | 10-126007 A | 5/1998 |
| JP | 2000-147604 A | 5/2000 |
| JP | 2002-214361 A | 7/2002 |
| JP | 2003258359 A | 9/2003 |
| JP | 2003-536061 | 12/2003 |
| JP | 2004-078255 A | 3/2004 |
| JP | 2004-94115 | 3/2004 |
| JP | 2004-361315 A | 12/2004 |
| JP | 2005-331273 A | 12/2005 |
| JP | 2006-162386 A | 6/2006 |
| JP | 2007-214564 | 8/2007 |
| JP | 2008-015434 A | 1/2008 |
| JP | 4108478 B2 | 6/2008 |
| JP | 2008-180719 A | 8/2008 |
| JP | 2009-103529 | 5/2009 |
| JP | 2009-170870 A | 7/2009 |
| JP | 2009-204691 | 9/2009 |
| JP | 2010-91855 | 4/2010 |
| JP | 2010-256291 A | 11/2010 |
| JP | 2011-003748 A | 1/2011 |
| JP | 2012-504771 A | 2/2012 |
| JP | 5096008 | 12/2012 |
| JP | 2013-050310 A | 3/2013 |
| JP | 2013-113669 A | 6/2013 |
| JP | 2014-059302 A | 4/2014 |
| JP | 2014-077658 A | 5/2014 |
| JP | 2016-146417 | 8/2016 |
| JP | 2016-176721 A | 10/2016 |
| JP | 2016-188808 A | 11/2016 |
| JP | 2016-540189 A | 12/2016 |
| JP | 2017-053833 A | 3/2017 |
| JP | 2017-134814 A | 8/2017 |
| JP | 2018-025632 A2 | 2/2018 |
| JP | 2019-060652 A | 4/2019 |
| JP | 2019-68528 A | 4/2019 |
| JP | 2019-509474 A | 4/2019 |
| JP | 2019-516101 A | 6/2019 |
| JP | 2020-510208 A | 4/2020 |
| JP | 2021-503085 A | 2/2021 |
| JP | 2021-507260 A | 2/2021 |
| JP | 6839861 B2 | 3/2021 |
| JP | 6865492 B2 | 4/2021 |
| JP | 2021-073462 A1 | 5/2021 |
| JP | 2021-73473 A1 | 5/2021 |
| JP | 2021-105613 A | 7/2021 |
| JP | 2021-519926 A | 8/2021 |
| JP | 2021-139918 A | 9/2021 |
| JP | 2021-532368 A | 11/2021 |
| JP | 2022-1885 A | 1/2022 |
| JP | 6995413 B2 | 1/2022 |
| JP | 2022-022361 A | 2/2022 |
| JP | 2022-36224 A | 3/2022 |
| JP | 7037830 B2 | 3/2022 |
| JP | 2022-526998 A | 5/2022 |
| JP | 2022-534500 A | 8/2022 |
| KR | 10-2000-0053620 A | 8/2000 |
| KR | 10-2009-0016499 A | 2/2009 |
| KR | 10-2012-0053045 A | 5/2012 |
| KR | 10-2012-0061033 A | 6/2012 |
| KR | 10-2013-0140554 A | 12/2013 |
| KR | 10-2014-0138724 | 12/2014 |
| KR | 10-2015-0045735 A | 4/2015 |
| KR | 10-2016-0101140 A | 8/2016 |
| KR | 10-2018-0049937 A | 5/2018 |
| KR | 10-2018-0064969 A | 6/2018 |
| KR | 10-2018-0128447 A | 12/2018 |
| KR | 10-2019-0076725 A | 7/2019 |
| KR | 10-2019-0117418 A | 10/2019 |
| KR | 10-2019-0120403 A | 10/2019 |
| KR | 10-2020-0011351 A | 2/2020 |
| KR | 10-2020-0075014 A | 6/2020 |
| KR | 10-2020-0096632 A | 8/2020 |
| KR | 10-2020-0128435 A | 11/2020 |
| KR | 10-2021-0021409 | 2/2021 |
| KR | 10-2218679 A | 2/2021 |
| KR | 10-2021-0029831 A | 3/2021 |
| KR | 10-2021-0065207 A | 6/2021 |
| KR | 10-2021-0137584 B1 | 11/2021 |
| KR | 10-2021-0137586 B1 | 11/2021 |
| KR | 10-2326493 B1 | 11/2021 |
| KR | 10-2326508 B1 | 11/2021 |
| KR | 10-2022-0003600 A | 1/2022 |
| KR | 10-2022-0017412 A | 2/2022 |
| KR | 10-2364531 B1 | 2/2022 |
| KR | 10-2022-0024177 A | 3/2022 |
| KR | 10-2022-0025924 A | 3/2022 |
| KR | 10-2022-0038691 A | 3/2022 |
| KR | 10-2398080 B1 | 5/2022 |
| WO | 99-42856 A1 | 8/1999 |
| WO | 2002/065153 A1 | 8/2002 |
| WO | 2006/044758 A2 | 4/2006 |
| WO | 2006/083349 A2 | 8/2006 |
| WO | 2013107709 A1 | 7/2013 |
| WO | 2014/014838 A2 | 1/2014 |
| WO | 2015/040671 A1 | 3/2015 |
| WO | 2015040671 | 3/2015 |
| WO | 2015/059705 A1 | 4/2015 |
| WO | 2017/112416 A1 | 6/2017 |
| WO | 2017/132704 A1 | 8/2017 |
| WO | 2017/184336 A2 | 10/2017 |
| WO | 2018028795 A1 | 2/2018 |
| WO | 2018082762 A1 | 5/2018 |
| WO | 2018/169758 A1 | 9/2018 |
| WO | 2018166609 A1 | 9/2018 |
| WO | 2018166610 A1 | 9/2018 |
| WO | 2018166611 A1 | 9/2018 |
| WO | 2018169758 | 9/2018 |
| WO | 2018/180391 A1 | 10/2018 |
| WO | 2018/181250 A1 | 10/2018 |
| WO | 2018/191495 A1 | 10/2018 |
| WO | 2019/010320 A1 | 1/2019 |
| WO | 2019/022941 A1 | 1/2019 |
| WO | 2019-064062 A1 | 4/2019 |
| WO | 2019115148 A1 | 6/2019 |
| WO | 2019/195054 A1 | 10/2019 |
| WO | 2019/221776 A2 | 11/2019 |
| WO | 2020/028173 A1 | 2/2020 |
| WO | 2020/210176 A1 | 10/2020 |
| WO | 2020/242834 A1 | 12/2020 |
| WO | 2020/251891 A1 | 12/2020 |
| WO | 2020/263735 A1 | 12/2020 |
| WO | 2021/021872 A1 | 2/2021 |
| WO | 2021/150860 A1 | 7/2021 |
| WO | 2021/236201 A2 | 11/2021 |
| WO | 2022/103778 A1 | 5/2022 |

OTHER PUBLICATIONS

"Search Report" for International Patent Application No. PCT/EP2016/077499, 2 pages, International Searching Authority/ EPO, Rijswijk, the Netherlands.

"Notification of Transmittal of the International Search Report and the Written Opinion of the International Searching Authority, or the Declaration" for Internatonal Patent Application No. PCT/US2020/033630, dated Sep. 9, 2020, 10 pages, International Searching Authority, Korean Intellectual Property Office, Daejeon, Republic of Korea.

(56) References Cited

OTHER PUBLICATIONS

U.S. Appl. No. 16/841,930, filed Apr. 7, 2020, USPTO.
International Preliminary Report on Patentability received for PCT Application Serial No. PCT/US2020/033630 dated Dec. 9, 2021, 8 pages.
Plant, et al., 256-Channel Bidirectional Optical Interconnect Using VCSELs and Photodiodes on CMOS, IEEE Journal of Lightwave Technology, Aug. 2001, pp. 1093-1103, vol. 19, No. 8.
Knodl, et al., Bipolar Cascade VCSEL with 130% Differential Quantum Efficiency, Annual Report 2000, Optoelectronics Department, University of ULM, pp. 11-14.
R.A. Morgan, et al., Two-Dimensional Matrix Addressed Vertical Cavity Top-Surface Emitting Laser Array Display, IEEE Photonics Technology Letters, Aug. 1994, pp. 913-917, vol. 6, No. 8.
M. Orenstein, et al., Matrix Addressable Vertical Cavity Surface Emitting Laser Array, Electronics Letters, Feb. 28, 1991, pp. 437-438, vol. 27, No. 5.
K.M. Geib, et al., Fabrication and Performance of Two-Dimensional Matrix Addressable Arrays of Integrated Vertical-Cavity Lasers and Resonant Cavity Photodetectors, IEEE Journal of Selected Topics In Quantum Electronics, Jul./Aug. 2002, pp. 943-947, vol. 8, No. 4.
Moench, et al., VCSEL Based Sensors for Distance and Velocity, Vertical Cavity Surface-Emitting Lasers XX, Edited by K. Choquette, J. Guenter, Proc of SPIE, 2016, 11 pages, vol. 9766, 07660A.
Decision to Grant a Patent received for Japanese Patent Application Serial No. 2021-014376, dated Mar. 22, 2022, 05 pages (2 pages of English Translation and 3 pages of Official Copy).
Non-Final Office Action received for U.S. Appl. No. 17/164,773, dated Apr. 21, 2022, 8 pages.
Notice of Allowance received for Chinese Patent Application Serial No. 201880047615.6, dated Mar. 23, 2022, 7 pages (2 pages of English Translation and 5 pages of Official Copy).
Decision to Grant a Patent received for Korean Patent Application Serial No. 10-2018-7030512, dated Mar. 18, 2022, 3 pages (1 page of English Translation and 2 pages of Official Copy).
Decision to Grant a Patent received for Korean Patent Application Serial No. 10-2021-7036648, dated May 19, 2022, 3 pages (1 page of English Translation and 2 pages of Official Copy).
Decision to Grant a Patent received for Japanese Patent Application Serial No. 2019-549550, dated Feb. 25, 2022, 5 pages (2 pages of English Translation and 3 pages of Official Copy).
Office Action for Japanese Patent Application No. 2021-020502, Apr. 13, 2022, 10 pages (7 pages of English Translation and 3 pages of Official Copy).
Notice of Allowance received for U.S. Appl. No. 17/227,300, dated Feb. 8, 2022, 11 pages.
International Search Report and Written Opinion received for PCT Application Serial No. PCT/US2021/020749, dated Jan. 3, 2022, 11 pages.
International Preliminary Report on Patentability received for PCT Application Serial No. PCT/US2020/038927, dated Jan. 6, 2022, 9 pages.
Office Action received for Korean Application Serial No. 10-2020-7029872, dated Jan. 19, 2022, 32 pages (18 pages of English Translation and 14 pages of Official Copy).
Extended European Search Report received for European Patent Application Serial No. 19843301.3, dated Feb. 18, 2022, 10 pages.
International Preliminary Report on Patentability received for PCT Application Application No. PCT/US2020/043979, dated Feb. 10, 2022, 6 pages.
Office Action received for Korean Application Serial No. 10-2020-7029872, dated May 24, 2022, 05 pages (2 pages of English Translation and 3 pages of Official Copy).
Notice of Allowance received for Korean Patent Application Serial No. 10-2021-7006391, dated Feb. 9, 2022. 03 pages (1 page of English Translation and 2 pages of Official Copy).
Restriction Requirement received for U.S. Appl. No. 16/366,729, dated Jun. 3, 2022, 06 pages.
Office Action received for Japanese Patent Application Serial No. 2021-100687, dated Jul. 1, 2022, 09 pages. (6 pages of English Translation and 3 pages of Official Copy).
Restriction Requirement received for U.S. Appl. No. 16/523,459, dated Jun. 16, 2022, 05 pages.
Notice of Allowance received for U.S. Appl. No. 16/805,733, dated Aug. 22, 2022, 13 pages.
International Preliminary Report on Patentability received for PCT Application Serial No. PCT/US2021/020749, dated Sep. 15, 2022, 8 pages.
Non-Final Office Action received for U.S. Appl. No. 16/907,732, dated Jul. 13, 2022, 20 pages.
International Preliminary Report on Patentability received for PCT Application Serial No. PCT/US2021/014564, dated Aug. 4, 2022, 06 pages.
Notice of Allowance received for U.S. Appl. No. 16/895,588, dated Aug. 3, 2022, 9 pages.
Non-Final Office Action received for U.S. Appl. No. 16/366,729, dated Aug. 26, 2022, 09 pages.
International Search Report and Written Opinion received for PCT Patent Application No. PCT/US2018/057026, dated Dec. 16, 2019, 9 pages.
Office Action received for Japanese Patent Application Serial No. 2021-0168642, dated Aug. 25, 2022, 4 pages (2 pages of English Translation and 2 pages of Official Copy).
Office Action received for Japanese Patent Application Serial No. 2020-526502, dated Aug. 24, 2022, 10 pages (5 pages of English Translation and 5 pages of Official Copy).
Non-Final Office Action received for U.S. Appl. No. 16/523,459, dated Sep. 13, 2022, 11 pages.
Notice of Allowance received for U.S. Appl. No. 16/841,930, dated Jun. 29, 2022, 10 pages.
International Search Report and Written Opinion received for International Patent Application No. PCT/US2020/026964, dated Jul. 28, 2020, 8 pages.
International Preliminary Report on Patentability for International Patent Application No. PCT/US2019/024343, dated Oct. 15, 2020, 9 pages.
International Search Report and Written Opinion received for PCT Patent Application No. PCT/US2017/026109, dated Jun. 19, 2017, 15 pages.
International Search Report and Written Opinion received for PCT Patent Application No. PCT/US2018/021553, dated Jun. 20, 2018, 13 pages.
International Preliminary Report on Patentability received for PCT Patent Application No. PCT/US2017/026109, dated Nov. 1, 2018, 13 Pages.
International Search Report and the Written Opinion received for PCT Patent Application No. PCT/US2019/024343, dated Jul. 12, 2019, 15 Pages.
International Search Report and the Written Opinion received for PCT Patent Application No. PCT/US2019/043674, dated Nov. 15, 2019, 14 pages.
International Preliminary Report on Patentability received for PCT Patent Application No. PCT/US2018/041021, dated Feb. 6, 2020, 10 pages.
Extended European Search Report received for European Patent Application No. 17786325.5, dated Mar. 11, 2020, 22 pages.
Non-Final Office Action received for U.S. Appl. No. 15/456,789, dated Sep. 25, 2019, 10 pages.
Notice of Allowance received for U.S. Appl. No. 15/456,789, dated Apr. 29, 2020, 5 pages.
Non-Final Office Action received for U.S. Appl. No. 15/915,840, dated May 7, 2020, 11 pages.
Notice of Allowance received for U.S. Appl. No. 15/915,840, dated Jan. 19, 2021, 6 pages.
Extended European Search Report received for European Patent Application No. 18767885.9, dated Nov. 18, 2020, 10 pages.
Office Action received for Japanese Patent Application No. 2019-549550, dated Mar. 22, 2021, 6 pages (3 pages of English Translation and 3 pages of Official Copy).

(56) References Cited

OTHER PUBLICATIONS

Office Action received for Korean Patent Application No. 10-2019-7029980, dated Mar. 26, 2021, 6 pages (3 pages of English Translation and 3 pages of Official Copy).
International Preliminary Report on Patentability received for International Patent Application No. PCT/US2018/021553, dated Sep. 26, 2019, 9 Pages.
Notice of Allowance received for Japanese Patent Application No. 2018-555665, dated Dec. 2, 2020, 05 pages (2 pages of English Translation and 3 pages of Official Copy).
Office Action received for Japanese Patent Application No. 2021-014376, dated Sep. 27, 2021, 18 pages (12 pages of English Translation and 6 paegs of Official Copy).
International Preliminary Report on Patentability received for PCT Application Serial No. PCT/US2020/036634, dated Dec. 23, 2021, 6 pages.
International Search Report and Written Opinion received for PCT Application Serial No. PCT/US2021/058687, dated Mar. 3, 2022, 11 pages.
Office Action received for Korean Patent Application No. 10-2018-7030512, dated Dec. 23, 2021, 7 pages. (3 pages of English Translation and 4 pages of Official Copy).
Notice of Allowance received for Korean Patent Application No. 10-2019-7029980, dated Aug. 6, 2021, 3 pages (1 page of English Translation and 2 pages of Official Copy).
Office Action received for Japanese Patent Application No. 2019-549550, dated Aug. 27, 2021, 7 pages (5 pages of English Translation and 2 pages of Official Copy).
Notice of Allowance received for U.S. Appl. No. 16/028,774, dated Aug. 21, 2019, 10 pages.
Non-Final Rejection received for U.S. Appl. No. 16/686,163, dated Apr. 16, 2020, 9 pages.
Notice of Allowance received for U.S. Appl. No. 16/686,163, dated Oct. 16, 2020, 9 pages.
Office Action received for Korean Patent Application No. 10-2020-7005082, dated May 8, 2020, 19 pages (11 pages of English Translation and 8 pages of Official Copy).
Office Action received for Japanese Patent Application No. 2020-504014, dated Sep. 2, 2020, 7 pages (3 pages of English Translation and 4 pages of Official Copy).
Notice of Grant received for Korean Patent Application No. 10-2020-7005082, dated Nov. 24, 2020, 5 pages (3 pages of English Translation and 2 pages of Official Copy).
Office Action received for Chinese Patent Application No. 201880047615.6, dated Jan. 18, 2021, 16 pages (8 pages of English Translation and 8 pages of Official Copy).
Notice of Allowance received for Japanese Patent Application No. 2020-504014, dated Feb. 15, 2021, 5 pages (2 pages of English Translation and 3 pages of Official Copy).
Extended European Search Report received for European Patent Application No. 18839499.3, dated Mar. 4, 2021, 10 pages.
Office Action received for Korean Patent Application No. 10-2021-7004589, dated Mar. 10, 2021, 9 pages (5 pages of English Translation and 4 pages of Official Copy).
Office Action received for Japanese Patent Application No. 2021-056628, dated Jun. 14, 2021, 6 pages (3 pages of English Translation and 3 pages of Official Copy).
Notice of Allowance received for Korean Patent Application No. 10-2021-7004589, dated Aug. 6, 2021, 2 pages (1 page of English Translation and 1 page of Official Copy).
Office Action received for Chinese Patent Application Serial No. 201880047615.6, dated Aug. 25, 2021, 12 pages (6 pages of English Translation and 6 pages of Official Copy).
Notice of Allowance received for Japanese Patent Application Serial No. 2021-056628, dated Nov. 2, 2021, 5 pages (2 pages of English Translation and 3 pages of Official Copy).
Non-Final Office Action received for U.S. Appl. No. 16/168,054, dated Jun. 1, 2021, 15 pages.

International Preliminary Report on Patentability received for PCT Patent Application No. PCT/US2018/057026, dated May 28, 2020, 7 pages.
Extended European Search Report received for European Patent Application No. 18918938.4, dated Jul. 6, 2021, 9 pages.
Office Action received for Korean Patent Application No. 10-2020-7016928, dated Jul. 16, 2021, 13 pages (7 pages of English Translation and 6 pages of Official Copy).
Partial Supplementary European Search Report received for European Patent Application No. 17786325.5, dated Nov. 7, 2019, 17 pages.
Office Action received for Korean Patent Application No. 10-2020-7029872, dated Jul. 19, 2021, 23 pages (13 pages of English Translation and 10 pages of Official Copy).
Extended European Search Report received for European Patent Application Serial No. 19781037.7, dated Oct. 25, 2021, 9 pages.
Office Action received for Korean Patent Application No. 10-2021-7006391, dated May 14, 2021, 17 pages (9 pages of English Translation and 8 pages of Official Copy).
International Preliminary Report on Patentability received for PCT Application Serial No. PCT/US2019/043674, dated Feb. 18, 2021, 10 pages.
Office Action received for European Patent Application No. 17786325.5, dated Dec. 17, 2021, 5 pages.
International Preliminary Report on Patentability received for PCT Patent Application No. PCT/US2020/026964, dated Oct. 21, 2021, 7 pages.
Non-Final Office Action received for U.S. Appl. No. 17/227,300, dated Jun. 30, 2021, 8 pages.
International Search Report and Written Opinion received for PCT Patent Application No. PCT/US2018/041021, dated Nov. 5, 2018, 13 Pages.
International Search Report and the Written Opinion received for PCT Patent Application No. PCT/US2020/036634, dated Sep. 21, 2020, 7 pages.
International Search Report and the Written Opinion received for PCT Patent Application No. PCT/US2020/038927, dated Oct. 7, 2020, 12 pages.
International Search Report and the Written Opinion received for PCT Patent Application No. PCT/US2020/043979, dated Nov. 10, 2020, 7 pages.
International Search Report and the Written Opinion received for PCT Patent Application No. PCT/US2021/014564, dated May 17, 2021, 8 pages.
Office Action received for Korean Patent Application Serial No. 10-2021-7036648, dated Dec. 17, 2021, 8 pages (4 pages of English Translation and 4 pages of Official Copy).
Decision to Grant a Patent received for Korean Patent Application Serial No. 10-2020-7016928, dated Nov. 16, 2021, 3 pages (1 page of English Translation and 2 pages of Official Copy).
Final Office Action received for U.S. Appl. No. 16/168,054, dated Jan. 26, 2022, 16 pages.
Office Action received for Korean Patent Application Serial No. 10-2021-7006391, dated Oct. 22, 2021, 5 pages. (2 pages of English Translation and 3 pages of Official Copy).
Office Action received for Korean Patent Application No. 10-2023-7007292, dated Apr. 17, 2023, 19 pages (10 pages of English Translation and 9 pages of Official Copy).
Decision to Grant a Patent received for Korean Patent Application Serial No. 10-2023-7009114, dated May 16, 2023, 3 pages (1 page of English Translation and 2 pages of Official Copy).
Office Action for Japanese Patent Application No. 2021-572877, dated May 12, 2023, 12 pages (8 pages of English Translation and 4 pages of Official Copy).
Office Action received for Japanese Patent Application No. 2021-559434, dated May 26, 2023, 17 pages (11 pages of English Translation and 6 pages of Official Copy).
Extended European Search Report received for European Patent Application No. 20831915.2, dated Jun. 2, 2023, 9 pages.
International Preliminary Report on Patentability received for PCT Application Serial No. PCT/US2021/058687, dated May 25, 2023, 7 pages.

(56) References Cited

OTHER PUBLICATIONS

Notice of Allowance received for Chinese Patent Application Serial No. 201780024892.0, dated May 30, 2023, 2 pages (Official Copy Only).
Extended European Search Report received for European Patent Application No. 20822328.9, dated May 4, 2023, 34 pages.
Non-Final Office Action received for U.S. Appl. No. 17/227,295, dated Mar. 9, 2023, 10 pages.
Notice of Allowance received for U.S. Appl. No. 16/841,930, dated Apr. 17, 2023, 9 pages.
Notice of Allowance received for U.S. Appl. No. 16/805,733, dated Nov. 10, 2022, 5 pages.
Notice of Allowance received for U.S. Appl. No. 16/841,930, dated Oct. 3, 2022, 8 pages.
Non-Final Office Action received for U.S. Appl. No. 16/168,054, dated Oct. 20, 2022, 16 pages.
Notice of Allowance received for U.S. Appl. No. 17/164,773, dated Nov. 2, 2022, 8 pages.
Notice of Allowance received for U.S. Appl. No. 16/805,733, dated Jan. 25, 2023, 5 pages.
Office Action received for Chinese Patent Application Serial No. 201780024892.0, dated Sep. 2, 2022, 28 pages (11 pages of English Translation and 17 pages of Official Copy).
Extended European Search Report received in European Application No. 20787345.6, dated Dec. 5, 2022, 8 pages.
Non-Final Office Action received for U.S. Appl. No. 17/155,626, dated Apr. 12, 2023, 24 pages.
Notice of Allowance received for U.S. Appl. No. 17/164,773, dated Feb. 1, 2023, 8 pages.
Notice of Allowance received for U.S. Appl. No. 16/841,930, dated Jan. 30, 2023, 9 pages.
International Search Report and Written Opinion received for PCT Patent Application No. PCT/US2022/028297, dated Mar. 13, 2023, 11 pages.
Restriction Requirement received for U.S. Appl. No. 16/941,896, dated Jan. 24, 2023, 06 pages.
Partial European Search Report received for European Patent Application No. 22178999.3, dated Oct. 10, 2022, 22 pages.
Decision to Grant received for Korean Patent Application Serial No. 10-2022-7021139, dated Dec. 14, 2022, 3 pages (1 page of English Translation and 2 pages of Official Copy).
Office Action received for Japanese Patent Application No. 2021-020502, dated Jan. 23, 2023, 6 pages (4 pages of English Translation and 2 pages of Official Copy).
Office Action received for Korean Patent Application No. 10-2021-7016081, dated Oct. 25, 2022, 4 pages (2 pages of English Translation and 2 pages of Official Copy).
Office Action received for Japanese Patent Application Serial No. 2021-199077, dated Dec. 23, 2022, 9 pages (6 pages of English Translation and 3 pages of Official Copy).
Office Action received for Korean Patent Application No. 10-2022-7028820, dated Dec. 15, 2022, 12 pages (6 pages of English Translation and 6 pages of Official Copy).
Extended European Search Report received for European Patent Application No. 20815113.4, dated Jan. 31, 2023, 14 pages.
Partial European Search Report received for European Patent Application No. 20822328.9, dated Feb. 6, 2023, 20 pages.
Office Action received for Korean Patent Application No. 10-2022-7004969, dated Jan. 9, 2023, 11 pages (6 pages of English Translation and 5 pages of Official Copy).
Office Action received for Japanese Patent Application Serial No. 2020-552870, dated Nov. 29, 2022, 11 pages (7 pages of English Translation and 4 pages of Official Copy).
Office Action received for Japanese Patent Application Serial No. 2022-002790, dated Dec. 26, 2022, 10 pages (7 pages of English Translation and 3 pages of Official Copy).
Decision to Grant received for Korean Patent Application Serial No. 10-2020-7029872, dated Nov. 28, 2022, 3 pages (1 page of English Translation and 2 pages of Official Copy).
Office Action received for Korean Patent Application No. 10-2022-7015754, dated Dec. 12, 2022, 21 pages (11 pages of English Translation and 10 pages of Official Copy).
Notice of Allowance received for U.S. Appl. No. 16/366,729, dated Mar. 8, 2023, 7 pages.
Extended European Search Report received for European Patent Application No. 22178999.3, dated Mar. 6, 2023, 25 pages.
International Search Report and Written Opinion received for PCT Patent Application No. PCT/US2022/019054, dated Feb. 20, 2023, 13 pages.
Office Action received for Korean Application Serial No. 10-2021-7036300, dated Feb. 9, 2023, 14 pages (7 pages of English Translation and 7 pages of Official Copy).
Decision to Grant received for Korean Patent Application Serial No. 10-2021-7040665, dated Feb. 23, 2023, 3 pages (1 page of English Translation and 2 pages of Official Copy).
Office Action received for Chinese Patent Application Serial No. 201880017776.0, dated Feb. 16, 2023, 22 pages (10 pages of English Translation and 12 pages of Official Copy).
Office Action received for Chinese Patent Application Serial No. 201880074279.4, dated Mar. 1, 2023, 23 pages (9 pages of English Translation and 14 pages of Official Copy).
Notice of Allowance received for U.S. Appl. No. 17/164,773, dated Apr. 5, 2023, 8 pages.
Office Action received for Japanese Patent Application Serial No. 2021-100687, dated Mar. 14, 2023, 05 pages. (3 pages of English Translation and 2 pages of Official Copy).
Office Action received for Japanese Patent Application No. 2020-526502, dated Mar. 14, 2023, 8 pages (5 pages of English Translation and 3 pages of Official Copy).
Office Action received for Japanese Patent Application No. 2021-168642, dated Mar. 15, 2023, 5 pages (3 pages of English Translation and 2 pages of Official Copy).
Office Action received for Japanese Patent Application No. 2022-80688, dated Mar. 17, 2023, 11 pages (7 pages of English Translation and 4 pages of Official Copy).
Final Office Action received for U.S. Appl. No. 16/523,459, dated Apr. 14, 2023, 13 pages.
Office Action received for Korean Patent Application No. 10-2022-7036873, dated Mar. 29, 2023, 22 pages (12 pages of English Translation and 10 pages of Official Copy).
Notice of Allowance received for U.S. Appl. No. 16/805,733, dated May 8, 2023, 5 pages.

\* cited by examiner

EYE-SAFE LONG-RANGE LIDAR SYSTEM USING ACTUATOR

CROSS REFERENCE TO RELATED APPLICATION

The present application is a non-provisional application of U.S. Provisional Patent Application No. 62/854,782, filed on May 30, 2019, entitled "Eye-Safe Long-Range LIDAR System Using Actuator". The entire contents of U.S. Provisional Patent Application No. 62/854,782 are herein incorporated by reference.

The section headings used herein are for organizational purposes only and should not to be construed as limiting the subject matter described in the present application in any way.

INTRODUCTION

Autonomous, self-driving, and semi-autonomous automobiles use a combination of different sensors and technologies such as radar, image-recognition cameras, and sonar for detection and location of surrounding objects. These sensors enable a host of improvements in driver safety including collision warning, automatic-emergency braking, lane-departure warning, lane-keeping assistance, adaptive cruise control, and piloted driving. Among these sensor technologies, light detection and ranging (LIDAR) systems take a critical role, enabling real-time, high-resolution 3D mapping of the surrounding environment. In order for LIDAR systems to be deployed broadly and in high-volume, they need to be both low-cost and reliable, as well as compact physically.

As LIDAR systems become broadly available and the market price drops, they will also start to be deployed in many other applications, such as security monitoring, industrial robots, and drones. The application requirements of these other applications, as well as within the autonomous vehicle space itself, are widely varying. The required maximum range, angular resolution, and frame rate for an autonomous car that can navigate at high-speed, might substantially exceed the requirements for an industrial robot that moves inside a building. In such case, the cost and performance of a LIDAR system will be optimized to provide the best match with the application specification.

BRIEF DESCRIPTION OF THE DRAWINGS

The present teaching, in accordance with preferred and exemplary embodiments, together with further advantages thereof, is more particularly described in the following detailed description, taken in conjunction with the accompanying drawings. The skilled person in the art will understand that the drawings, described below, are for illustration purposes only. The drawings are not necessarily to scale, emphasis instead generally being placed upon illustrating principles of the teaching. The drawings are not intended to limit the scope of the Applicant's teaching in any way.

DESCRIPTION OF VARIOUS EMBODIMENTS

Figure 1A:
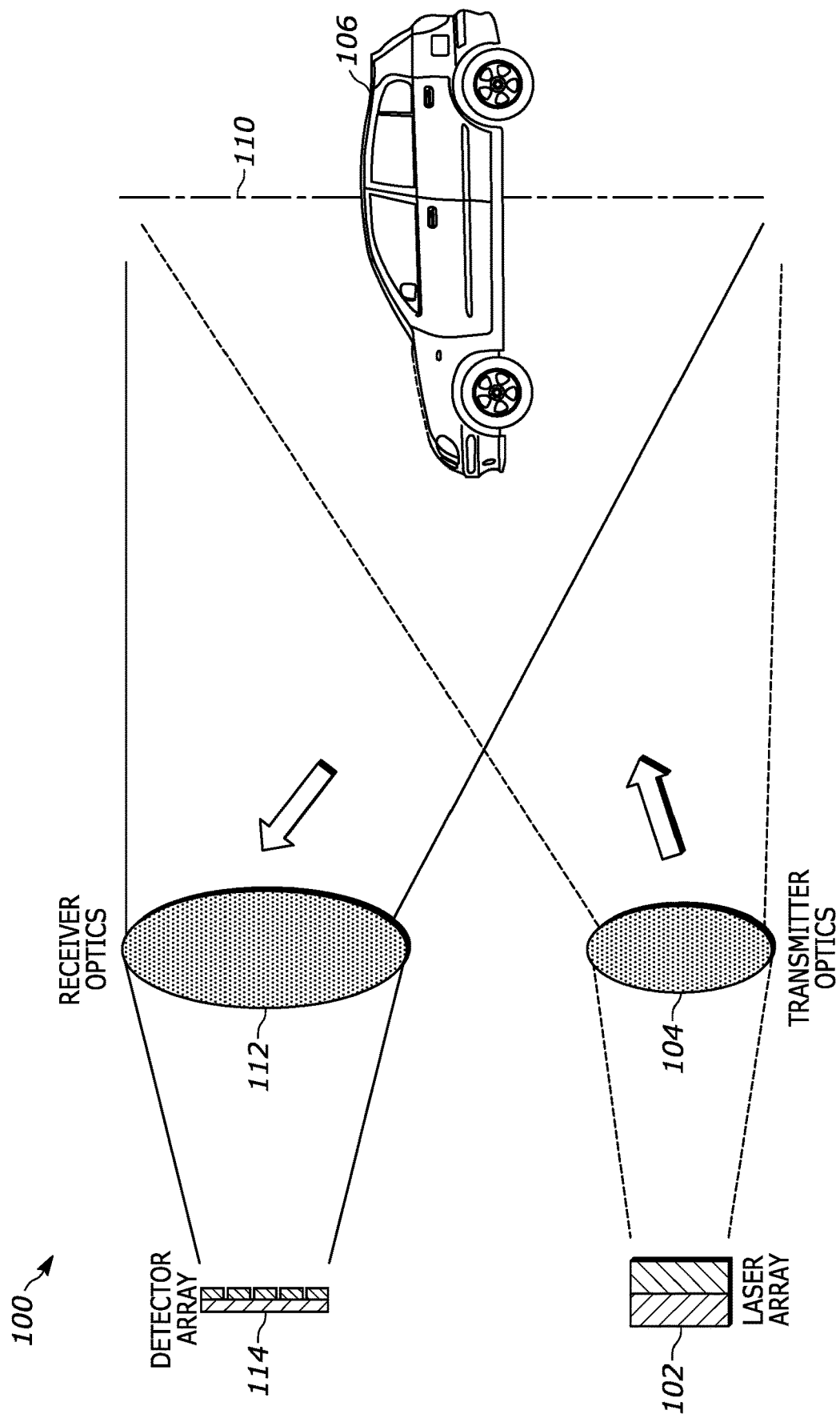
FIG. 1A illustrates a schematic diagram of a known solid-state LIDAR system.

The present teaching will now be described in more detail with reference to exemplary embodiments thereof as shown in the accompanying drawings. While the present teaching is described in conjunction with various embodiments and examples, it is not intended that the present teaching be limited to such embodiments. On the contrary, the present teaching encompasses various alternatives, modifications and equivalents, as will be appreciated by those of skill in the art. Those of ordinary skill in the art having access to the teaching herein will recognize additional implementations, modifications, and embodiments, as well as other fields of use, which are within the scope of the present disclosure as described herein.

Reference in the specification to "one embodiment" or "an embodiment" means that a particular feature, structure, or characteristic described in connection with the embodiment is included in at least one embodiment of the teaching. The appearances of the phrase "in one embodiment" in various places in the specification are not necessarily all referring to the same embodiment.

It should be understood that the individual steps of the method of the present teaching can be performed in any order and/or simultaneously as long as the teaching remains operable. Furthermore, it should be understood that the apparatus and method of the present teaching can include any number or all of the described embodiments as long as the teaching remains operable.

The present teaching relates to Light Detection and Ranging (LIDAR), which is a remote sensing method that uses laser light to measure distances (ranges) to objects. Autonomous vehicles make use of LIDAR systems to generate a highly accurate 3D map of the surrounding environment with fine resolution. The systems and methods described herein are directed towards providing a pulsed time-of-flight (TOF) LIDAR system with high levels of reliability, while also maintaining long measurement range as well as low cost. One aspect of the present teaching is focused on the optimization of the overall LIDAR system for cost, while still providing excellent reliability and performance in a compact physical size.

The systems and methods described herein that provide a pulsed TOF LIDAR are also configured to maintain Class 1 eye safety. A Class 1 eye safety rating means the system is safe under all conditions of normal use. To maintain Class 1 eye safety, the laser optical energy or laser optical power cannot exceed a maximum permissible exposure (MPE) level as defined by U.S. and international safety standards. However, the measurement range of a LIDAR system is strongly dependent on the maximum transmitted optical pulse energy or power level. Therefore, it is desirable for automotive LIDAR systems to intentionally operate as close to the Class 1 MPE limit as feasible.

Given that all LIDAR systems operating at the same wavelength will be subject to the same MPE limits, further improvements in range for one LIDAR system relative to another LIDAR system operating at power levels near the MPE power limit, must come by innovating aspects of the optical system. One aspect of the present teaching is a LIDAR system that uses a highly collimated laser beam, where all the energy is transmitted into a small FOV. Such a configuration provides a relatively long measurement range compared with a system where the same amount of laser light is dispersed over a wider FOV. That is, using a highly collimated laser beam, combined with a receiver design that allows measurement over a similarly small field of view (FOV), will result in a desirable ratio of reflected signal power to background light level, which improves range capability.

One type of known LIDAR system is a so-called Flash LIDAR system, which employs an emission source that emits laser light over a wide FOV. Some Flash LIDAR systems are also solid-state with no moving parts, whereas other Flash LIDAR systems use a mirror scanning in one-direction and illuminate a "line" which is swept through the full field-of-view incrementally. A solid-state Flash LIDAR system with no moving parts must illuminate the entire scene with a single illumination event. But, for LIDAR systems operating at the Class 1 eye safety MPE limit, the wide FOV illuminated by a solid-state Flash LIDAR significantly limits measurement range compared to a system where the light from the emission source is highly collimated.

It should be understood that a measurement, or measurement point, in a LIDAR system is produced by processing a particular detected signal that is produced by a particular illumination at the target range. A TOF is calculated based on this particular detected signal. The particular detected signal for a measurement point can be generated by a single detector, or multiple detectors, depending on how the system is controlled as described further herein. Also, the particular detected signal for a measurement point can be generated by a single laser, or multiple lasers, depending in how the system is controlled.

Some pulsed TOF LIDAR systems according to the present teaching use collimated transmitter laser beams with optical power/energy at or slightly below the MPE limit for Class 1 eye safety to provide a significant range increase compared to a conventional Flash LIDAR system. In addition, some pulsed TOF LIDAR systems according to the present teaching use pulse averaging and/or pulse histogramming of multiple laser pulses to improve Signal-to-Noise Ratio (SNR), which further improves range. These LIDAR systems employ a very high single pulse frame rate, well above 60 Hz and even up to a few kHz, to enable averaging of multiple pulses.

One important performance goal of an automotive LIDAR system is angular resolution of the optical system. In order to be able to clearly define separate objects in space and/or perform object identification through image analysis, a fine angular resolution is required for automotive LIDAR systems. Currently, automotive LIDAR systems require angular resolution that is less than about 0.2°. These systems would benefit from even higher resolution if it were achievable.

Furthermore, there should not be any "gaps" in coverage between measurement points, particularly at long distances. To illustrate why there should be no such gaps, consider a practical use situation of a 200 meter range. A 0.2° angle at 200 meters corresponds to a lateral distance of 0.7 meters. Since a typical person is approximately 0.15 meter in width, it would be possible for the LIDAR system to miss the presence of a person completely at a range of 200 meters if the resolution was 0.2°, and the collimated laser beam diameter at 200 meters was smaller than 0.7 meter.

Reliability is also an important aspect of LIDAR systems designed for autonomous vehicles. The operational environment is particularly challenging for automotive LIDAR systems. Failure of a LIDAR sensor could result in a collision and can also prevent operation of the vehicle. LIDAR systems without moving parts are generally more reliable compared to LIDAR systems that use rotating part or large-scale scanning mirrors. Moving parts are susceptible to mechanical wear and have limited lifetimes. The LIDAR system of the present teaching includes motion, but preferentially uses "frictionless" mechanisms that are not susceptible to wear-out to the same degree as a motor or other large-scale scanning mirror.

FIG. 1A illustrates a schematic diagram of a known solid-state LIDAR system. The system illustrated in FIG. 1A does not employ a flash transmitter that illuminates the full system field-of-view all at once. A laser array 102 generates various patterns of optical beams. An optical beam is emitted from an emitter in the array 102 when that emitter is activated by a control pulse. One or more emitters can be activated according to a particular sequence. The optical beams from the lasers in the laser array 102 propagate though common transmitter optics 104 that project the optical beams to the target 106 at a target plane 110. The target 106 in this particular example is an automobile 106, but it is understood that the target can be any object.

Portions of the light from the incident optical beams are reflected by the target 106. These portions of reflected optical beams share the receiver optics 112. A detector array 114 receives the reflected light that is projected by the receiver optics 112. In various embodiments, the detector array 114 is solid-state with no moving parts. The detector array 114 typically has a fewer number of individual detector elements than the transmitter array 102 has individual lasers.

The measurement resolution of the LIDAR system 100 is not determined by the size of the detector elements in the detector array 114, but instead is determined by the number of lasers in the transmitter array 102 and the collimation of the individual optical beams. In other words, the resolution is limited by a field-of-view of each optical beam. A processor (not shown) in the LIDAR system 100 performs a time-of-flight (TOF) measurement that determines a distance to the target 106 from optical beams transmitted by the laser array 102 that are detected at the detector array 114.

One feature of LIDAR systems according to the present teaching is that individual lasers and/or groups of lasers in the transmitter array 102 can be individually controlled. Each individual emitter in the transmitter array can be fired independently, with the optical beam emitted by each laser emitter corresponding to a three-dimensional (3D) projection angle subtending only a portion of the total system field-of-view. One example of such a LIDAR system is described in U.S. Patent Publication No. 2017/0307736 A1, which is assigned to the present assignee. The entire contents of U.S. Patent Publication No. 2017/0307736 A1 are incorporated herein by reference.

Another feature of LIDAR systems according to the present teaching is that detectors and/or groups of detectors in the detector array 114 can also be individually controlled. This independent control over the individual lasers and/or groups of lasers in the transmitter array 102 and over the detectors and/or groups of detectors in the detector array 114 provides for various desirable operating features including control of the system field-of-view, optical power levels, and scanning pattern.

Figure 1B:
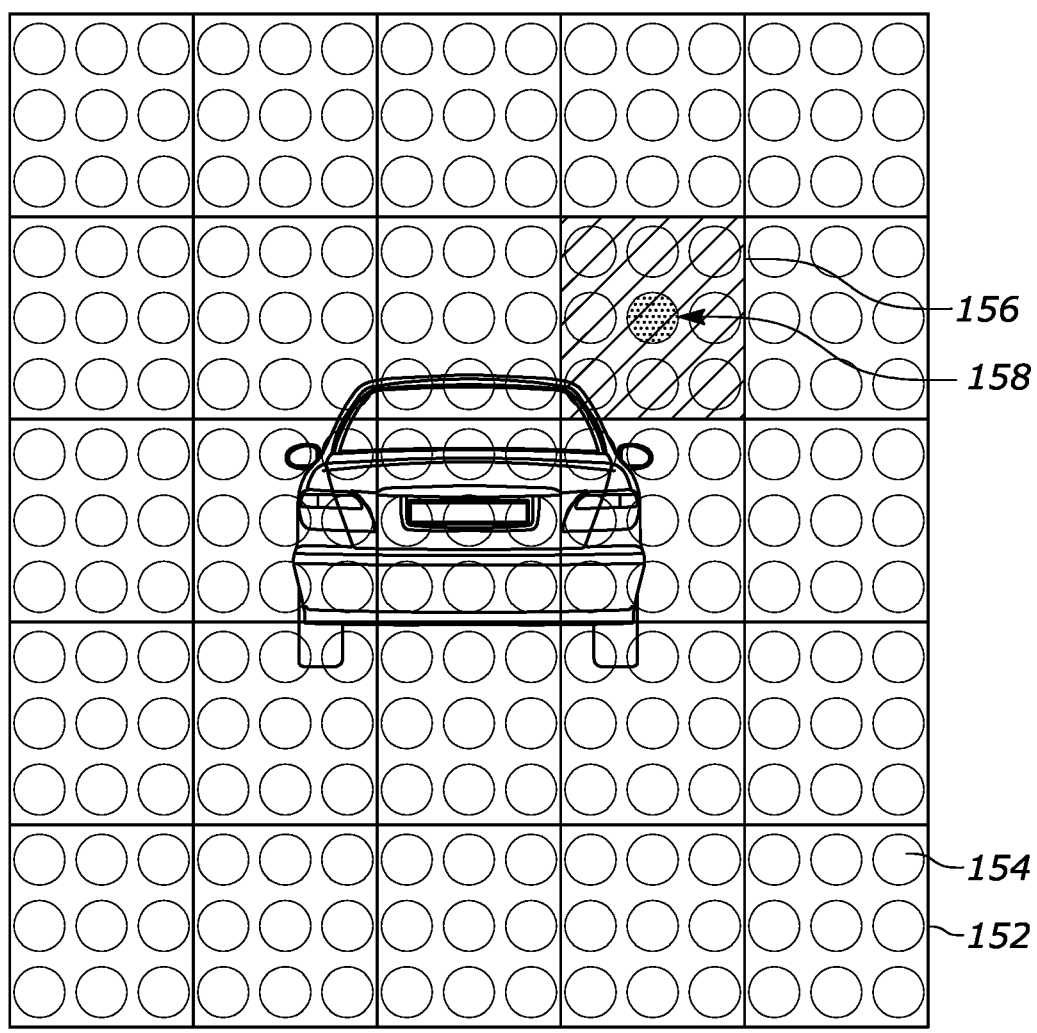
FIG. 1B illustrates a two-dimensional projection of the system Field-of-View (FOV) of the LIDAR system of FIG. 1A.

FIG. 1B illustrates a two-dimensional projection of the system field-of-view 150 of the LIDAR system of FIG. 1A. Referring to both FIGS. 1A and 1B, a field-of-view of an individual detector in the detector array is represented by a small square 152. An illuminated measurement point that results from a detected signal that is associated with an individual emitter in the transmitter laser array 102 is illustrated by a circle 154. A single 3D measurement point in the overall field-of-view of the LIDAR system of FIG. 1A is shown as particular dark circle 158, which corresponds to a specific individual laser in the laser array. It can be further seen in FIG. 1B that this measurement point falls within an individual detector where the field-of-view of that individual detector in the detector array 114 has been shown in the square 156 with a cross-hatch pattern for identification. This figure illustrates that the 3D resolution of some embodiments of the LIDAR system are determined by the number of lasers, as each laser corresponds to a specific angular projection angle that gives rise to the size of the circles 154 at the target range, and the relative size of the circles 154 and the squares 152 that represent the field-of-view of an individual detector element.

Thus, desired fields-of-views can be established by controlling particular individual or groups of lasers in a transmitter array and/or controlling individual or groups of detectors in a receive array. Various system fields-of-view can be established using different relative fields-of-view for individual or groups of emitters and/or individual or groups of detectors. The fields-of-view can be established so as to produce particular and/or combinations of performance metrics. These performance metrics include, for example, improved signal-to-noise ratio, longer range or controlled range, eye safe operation power levels, and lesser or greater controllable resolutions. Importantly, these performance metrics can be modified during operation to optimize the LIDAR system performance.

LIDAR systems according to the present teaching use an array drive control system that is able to provide selective control of particular laser devices in an array of laser devices in order to illuminate a target according to a desired pattern. Also, LIDAR systems according to the present teaching can use an array of detectors that generate detector signals that can be independently processed. Consequently, a feature of the LIDAR systems according to the present teaching is the ability to provide a variety of operating capabilities from a LIDAR system exclusively with electronic, non-mechanical and/or non-moving parts that include a fixed array of emitters and a fixed array of detectors with both the transmit and receive optical beams projected using shared transmit and receive optics. Such a LIDAR system configuration can result in a flexible system that is also compact in size, reliable in operation, and relatively low cost.

One feature of the LIDAR systems of the present teaching is that they rely on laser arrays to generate the optical beams and detector arrays to receive the portion of light from these optical beams that is reflected from the target. As such, they benefit from the many features of solid-state components in that they are relatively compact in size, reliable in operation, and low in cost. Various detector technologies can be used to construct a detector array for the LIDAR systems according to the present teaching. For example, Single Photon Avalanche Diode Detector (SPAD) arrays, Avalanche Photodetector (APD) arrays, and Silicon Photomultiplier Arrays (SPAs) can be used. The detector size not only sets the resolution by setting the FOV of a single detector, but also relates to the speed and detection sensitivity of each device. State-of-the-art two-dimensional arrays of detectors for LIDAR are already approaching the resolution of VGA cameras, and are expected to follow a trend of increasing pixel density similar to that seen with CMOS camera technology. Thus, smaller and smaller sizes of the detector FOV represented by square 204 are expected to be realized over time. For example, an APD array with 264,000 pixels (688(H)×384(V)) was recently reported in "A 250 m Direct Time-of-Flight Ranging System Based on a Synthesis of Sub-Ranging Images and a Vertical Avalanche Photo-Diodes (VAPD) CMOS Image Sensor", Sensors 2018, 18, 3642.

Various types of laser arrays can also be used in the LIDAR systems according to the present teaching. One example of a laser array is made from Vertical Cavity Surface Emitting Laser (VCSEL) laser devices. This can include top-emitting VCSELs, bottom-emitting VCSELs, and various types of high-power VCSELs. These VCSEL devices can be a stand-alone single emitter, or can be part of a multiple emitter VCSEL that can be fabricated as one- or two-dimensional arrays on the substrate. The VCSEL contacts that are energized to generate an optical beam from a particular laser can be addressed, or energized, individually and/or can be electrically connected together in various configurations to energize groups of VCSELs with a common electrical input signal. One feature of the LIDAR systems of the present teaching is a system and method for controlling the energizing of the one or more VCSEL devices in an array with an appropriate drive signal for a particular LIDAR system application. In some embodiments, the VCSEL array is monolithic and the lasers all share a common substrate. A variety of common substrate types can be used. For example, the common substrate can be a semiconductor material. The common substrate can also include a ceramic material. In some embodiments, the VCSEL array is a 2D VCSEL array and the 2D VCSEL array is assembled from a group of one-dimensional (1D) bars or even from numerous individual die.

One feature of the LIDAR systems according to the present teaching is that they can provide controllable fields-of-view for a variety of laser arrays. Some embodiments use VCSEL arrays. In some embodiments, the VCSELs are top-emitting VCSELs. In other embodiments, the VCSELs are bottom-emitting VCSELs. The individual VCSELs can have either a single large emission aperture, or the individual VCSELs can be formed from two or more sub-apertures within a larger effective emission diameter. A group of sub-apertures forming a larger effective emission region is sometimes referred to as a cluster. The sub-apertures in a cluster can be electrically connected in parallel so that they are electronically activated by a single control signal.

Figure 2A:
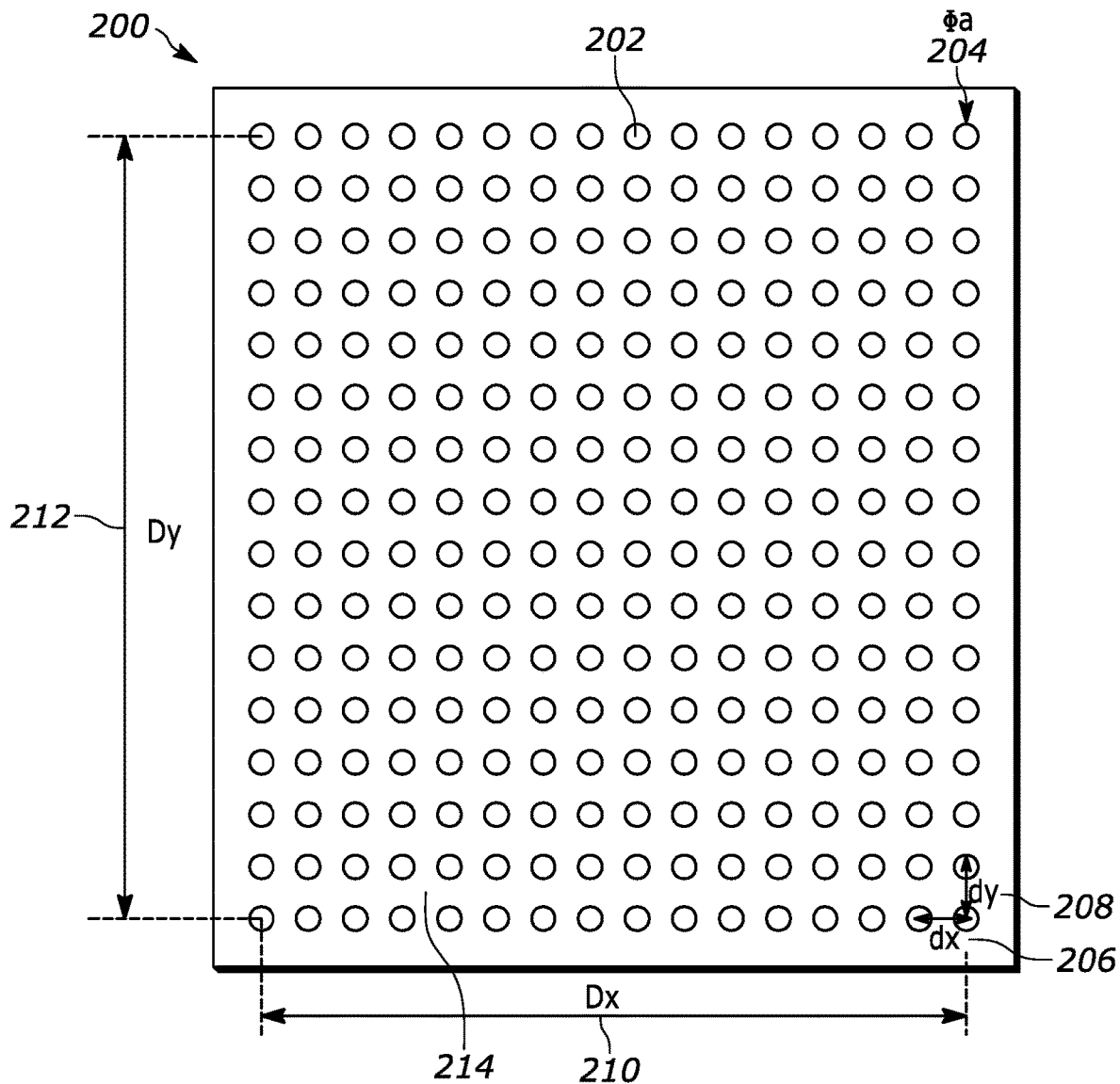
FIG. 2A illustrates a schematic diagram of a 2D monolithic VCSEL array with 256 separate laser emitters, where each emitter corresponds to a single large aperture that can be used in some embodiments of the LIDAR transmitter of the present teaching.

FIG. 2A illustrates a schematic diagram of a 2D monolithic VCSEL array 200 with 256 separate laser emitters 202, where each emitter 202 corresponds to a single large aperture, which is used in some embodiments of the LIDAR transmitter of the present teaching. Each laser emitter has an emission aperture of diameter, a 204. Emission from each single laser emitter 202 substantially fills the full emission aperture diameter, a 204. Each laser emitter, therefore, generates a laser beam with initial diameter, a, that is equal to the diameter of the emission aperture. The laser emitters are spaced uniformly in the horizontal direction with a spacing dx 206 and are spaced uniformly in the vertical direction with a spacing dy 208. The overall size of the array, as measured from the centers of the outermost lasers, is distance Dx 210 in the horizontal direction and distance Dy 212 in the vertical direction. The actual chip size will be slightly larger than the dimensions Dx 210 and Dy 212. In various embodiments, the emitters may produce optical beams with various shapes. For example, oval, square, rectangular and various odd shapes can be realized. There are regions 214 between emitters 202 that are gaps that have no emitter and thus do not provide illumination.

Figure 2B:
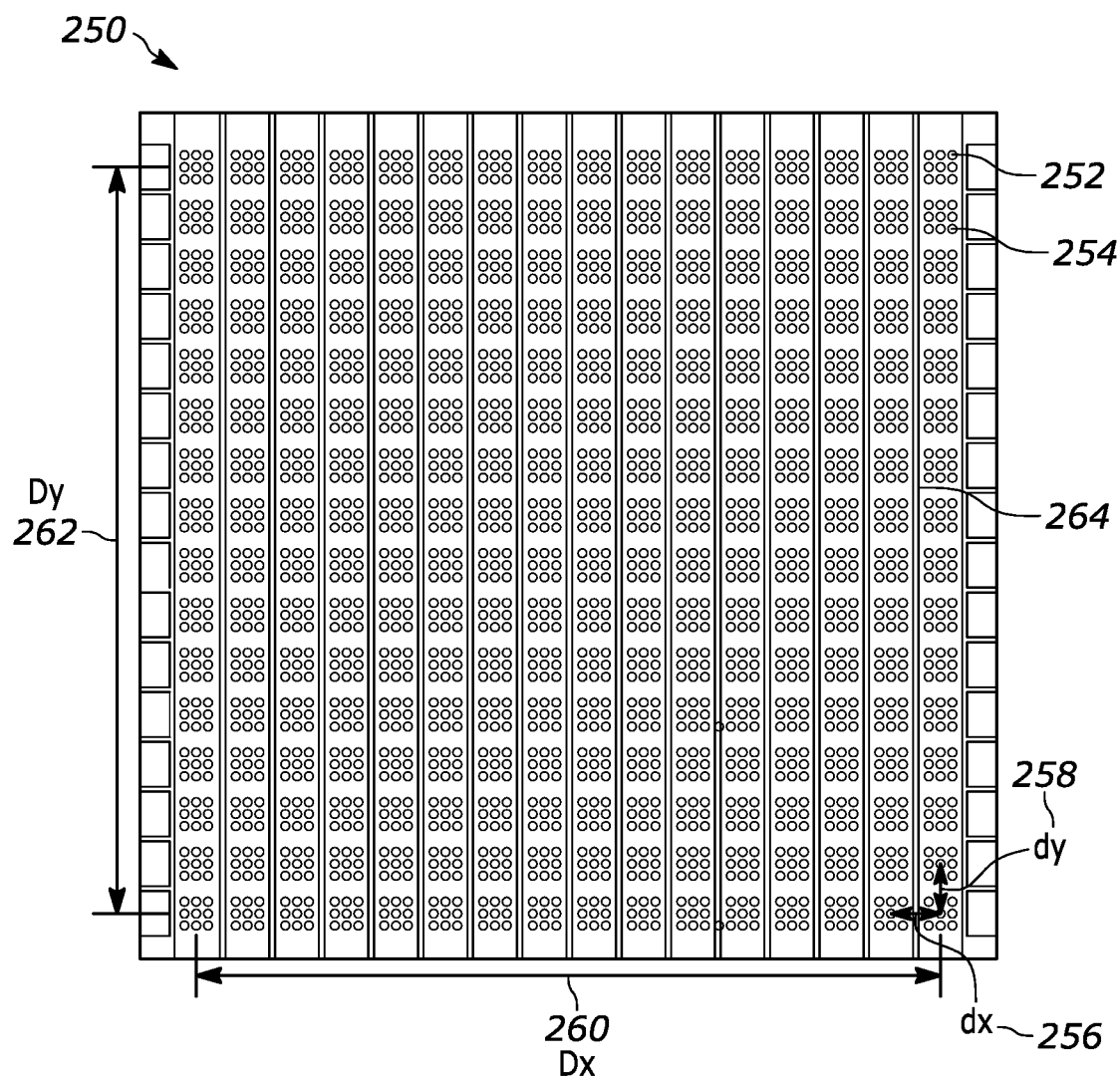
FIG. 2B illustrates a schematic diagram of a 2D monolithic VCSEL array with 256 separate laser emitters, where each emitter has nine sub-apertures that can be used in the LIDAR transmitter according to the present teaching.

FIG. 2B illustrates a schematic diagram of a 2D monolithic VCSEL array 250 with two hundred fifty-six separate laser emitters 252, where each laser emitter 252 has nine sub-apertures 254, that can be used in some embodiments of the LIDAR transmitter of the present teaching. Emission from each single laser emitter 252 results in emission from all nine sub-apertures 254. In the case where one or more of the nine sub-apertures 254 fails to emit light due to fabrication anomalies or device failures, the emitter 252 still functions and generates an optical beam albeit at a lower output power. The output optical beam will correspond to the pattern of the sub-apertures 254, and the sub-apertures 254 can be arranged in a variety of shapes. In the configuration shown, the output beam is nominally square in shape, corresponding to the emitter 252 shape of a 3×3 square array of the nine sub apertures 254. The laser emitters 252 are spaced uniformly in the horizontal direction with a spacing dx 256 and spaced uniformly in the vertical direction with a spacing dy 258. The overall size of the array, measured from the centers of the outermost lasers is distance Dx 260 in the horizontal direction and distance Dy 262 in the vertical direction. The actual chip size will be slightly larger than the distance Dx 260 and distance Dy 262. A variety of array patterns, including regular and irregular arrays, is possible. The VCSELs of FIGS. 2A-B include areas of the VCSEL die where no light emits, for example, regions 214, 264.

Some embodiments of the present teaching utilize bottom-emitting high-power arrays of VCSELs with a single large aperture per laser, and configured in a regularly spaced rectangular array, such as in the configuration shown in FIG. 2A. Other embodiments of the LIDAR system of the present teaching utilize top-emitting or bottom-emitting high-power arrays of VCSELs with an overall emission area comprising sub-apertures. However, one skilled in the art will appreciate that the present teaching is not limited to any single configurations of top- and bottom-emitting VCSELs, associated emission apertures, or array spacing or shapes.

One feature of the LIDAR systems of present teaching is that the emitters may not all emit light at the same wavelength. Thus, various emitters in the array can produce light with different wavelengths than other emitters. For example, emitters in a column or in a row may emit one wavelength, and emitters in an alternating column or row may emit a different wavelength. A variety of wavelength patterns can be used.

The use of 2D VCSEL arrays as a building block of the LIDAR systems of the present teaching establishes a transmitter platform that allows a small physical size for the transmitter. For example, it is possible to fabricate a typical 2D array with 256 high-power individual laser emitters on a monolithic chip having dimensions that are approximately 4 mm×4 mm. The monolithic 2D laser array is then used together with transmit optics that are chosen to keep the physical dimension as small as possible. For example, some embodiments use micro-lens arrays with sizes similar to the monolithic chip. Other embodiments use shared lenses having a diameter, for example, less than 20 mm. Yet other embodiments use diffractive optics with, for example, maximum dimensions of 20 mm diameter.

One feature of the LIDAR systems of the present teaching is that the spacing and/or the divergence of the optical beams produced by the emitters can be configured to generate emitter FOVs that have a desired pattern, shape or other specified characteristic. For example, the optical beams can be made to overlap or to not overlap. The choice of the FOV pattern provides control over, for example, range, eye safety power level, signal-to-noise ratio and/or resolution, depending on the particular pattern.

Figure 3A:
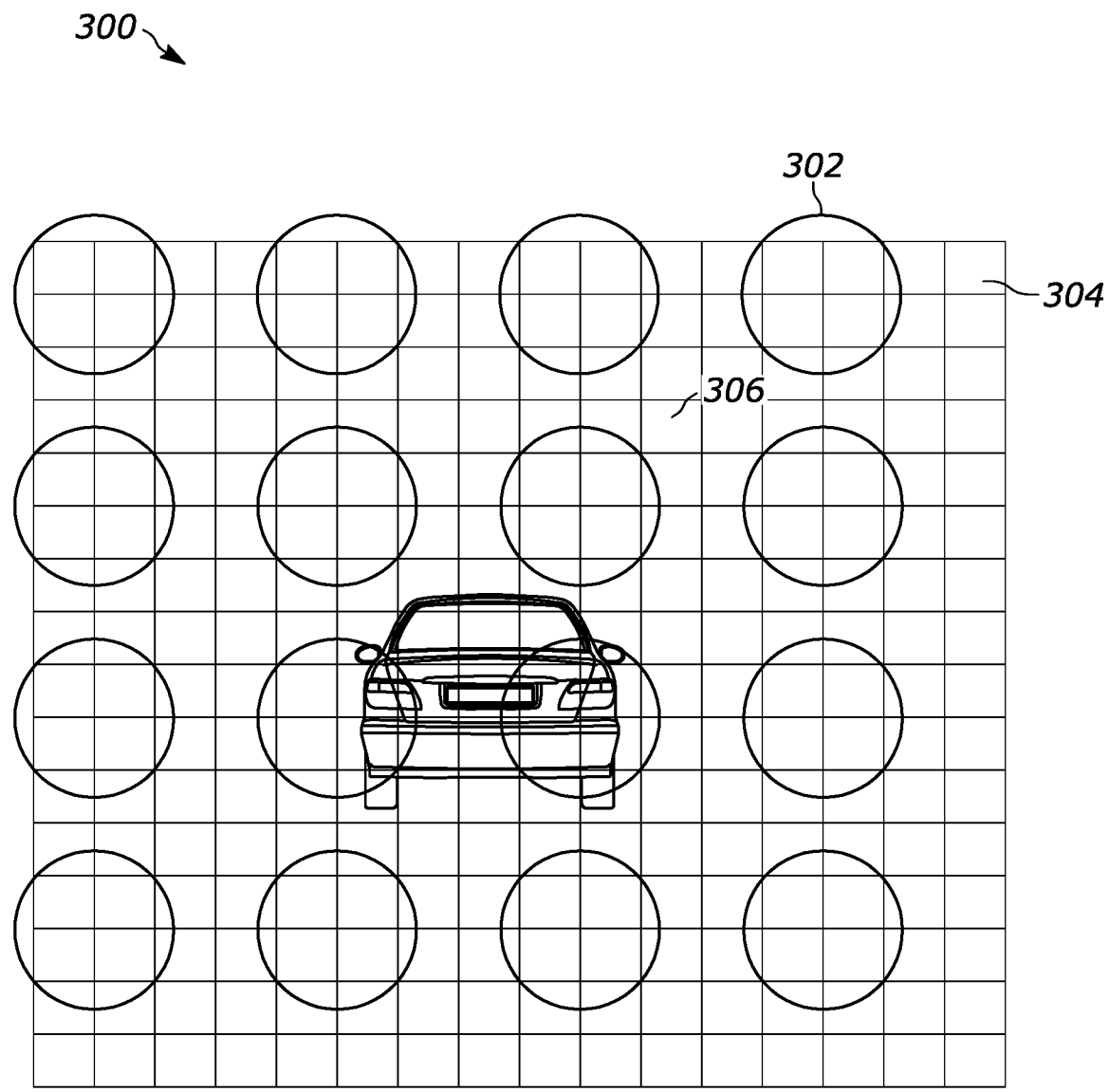
FIG. 3A illustrates a two-dimensional projection of the LIDAR system FOV for operation of an embodiment of a LIDAR system according to the present teaching where the divergence of a sixteen laser emitter beams results in gaps between beams when imaged onto the detector array.

FIG. 3A illustrates a two-dimensional projection of the LIDAR system FOV 300 for operation of an embodiment of a LIDAR system of the present teaching where the divergence of sixteen laser emitter beams results in gaps between beams when imaged onto the detector array. Laser emitter FOVs are represented by circles 302 and detector element FOVs are represented by squares 304. In the embodiment shown in FIG. 3A, a FOV with size of circle 302 nominally completely covers four detector element FOVs squares, 304. This optical configuration could result from a highly collimated optical beam. In contrast, an optical configuration that results in a larger emitter FOV will cover more detector elements, and may be achieved by reducing the collimation of the optical beams. In embodiments with higher collimation of the laser beams, such as the embodiment described in connection with FIG. 3A, the measurement range is improved. This is particularly true with smaller targets which might only partially be covered by a laser beam.

Figure 3B:
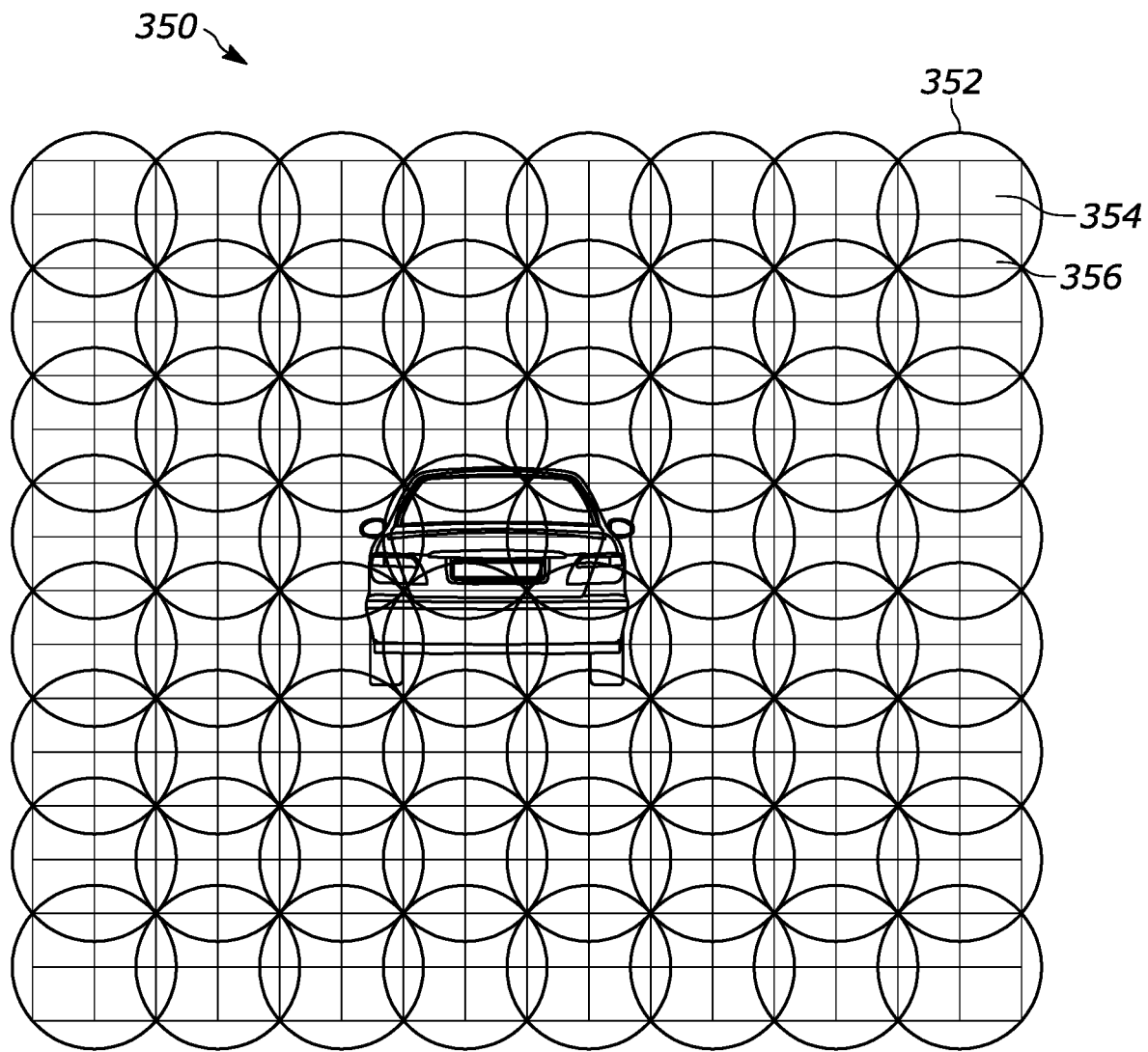
FIG. 3B illustrates a two-dimensional projection of the LIDAR system FOV for a LIDAR system where the divergence of an individual laser emitter beam is the same as shown in FIG. 3A, but the number of laser emitters has been increased to sixty-four in order to eliminate any gaps between beams when imaged onto the detector array.

Consider the numerical example of a collimated laser beam for a LIDAR system having 10 mrad of divergence. At a 100 meter range there would be a beam width of 1 meter. Since, for example, a person is approximately only 0.15 meter wide, a portion of the 1-meter beam will not fall onto the person, and thus will not contribute to the reflected signal used for measurement. In such configuration, it is preferred to generate a beam with smaller divergence, and smaller beam width. However, as illustrated in FIG. 3A, there is a tradeoff between beam divergence with coverage of the full field-of-view. In the projection of the LIDAR system FOV 300 shown in FIG. 3A, sixteen laser beams are used. In this optical configuration, significant gaps 306 result in the field-of-view. FIG. 3B illustrates one possible solution preventing these gaps.

FIG. 3B illustrates a two-dimensional projection of the LIDAR system FOV 350 for operation of a LIDAR system where the divergence of an individual laser emitter beam is the same as FIG. 3A, but the number of laser emitters has been increased to sixty-four beams in order to eliminate any gaps between beams when imaged onto the detector array. Laser emitter FOVs are represented by circles 352 and detector element FOVs are represented by squares 354. In this embodiment, the number of laser emitters is increased from sixteen to sixty-four, and the lasers are interleaved in such a fashion as to provide full coverage of the field-of-view without gaps. Rather, the beam FOVs have overlaps 356. The divergence of the optical beam from each emitter is the same as the embodiment of FIG. 3A. One solution for implementation of the LIDAR system of FIG. 3B, would be to have a one-to-one correspondence between each FOV 352 and an individual laser within the system, so in this case 64 individual lasers would be needed. In a real system, the number of lasers could increase to several thousand or more, and the cost of those lasers and associated electronics could be a concern.

Figure 4:
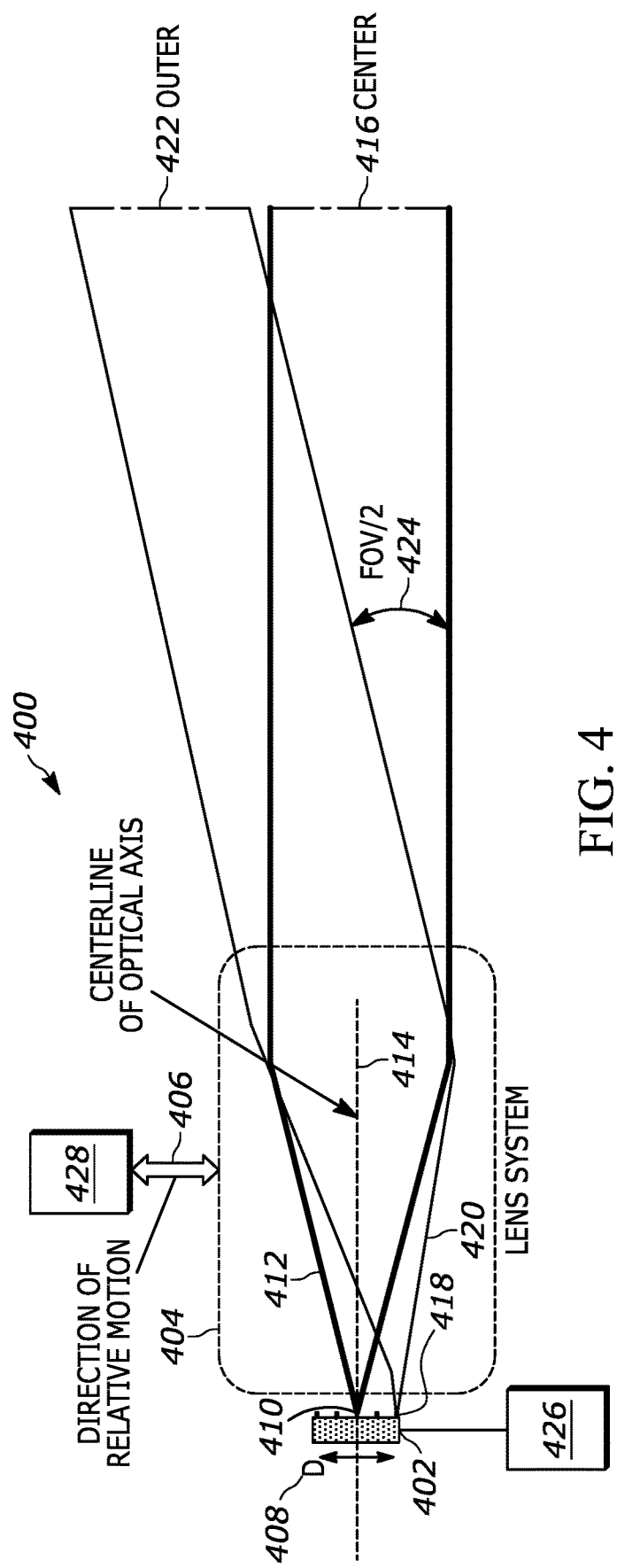
FIG. 4 illustrates a schematic of an embodiment of a transmitter of the present teaching where each laser emitter in an array corresponds to a specific projection angle.

FIG. 4 illustrates a schematic of an embodiment of a transmitter 400 of the present teaching where each laser emitter in an array 402 corresponds to a specific projection angle. The lens system 404 collimates and projects the optical beams generated by the emitters in the array 402. The lens system 404 is movable along an axis of relative motion 406. One feature of the present teaching is that a limited relative motion can be provided between the laser emitter(s) and the transmit optics to provide movement of the optical beams in the field-of-view. This movement allows control of an additional degree of freedom to provide a desired pattern of optical beams. The primary reason for introducing relative motion between the lens system and the laser array is to decrease the number of individual lasers required, with the tradeoff being the additional cost and complexity to incorporate the limited relative motion/actuation. Depending on the system requirements, there will be an optimum or at least advantageous cost, performance, and physical size which balances the number of individual lasers and the amount of relative motion required to cover the complete FOV without any gaps in the measurement field.

The array 402 has dimension D 408 in an emitting plane. At one relative position between the lens system 404 and the array 402, the emitter 410 in the center of the array 402 generates an optical beam 412 along a center line 414. The lens system 404 collimates and projects this beam 412 to a center position 416 at a target range. An outer emitter 418 at an edge of the array 402 with dimension D 408 generates an optical beam 420. The lens system 404 collimates and projects this beam 420 to an outer position 422 at the target range. In some embodiments, the projected angle 424 of the outer beam 420 from the edge emitter 418 with respect to the central beam 412 from the center emitter 410 is equal to half the field-of-view (FOV/2). A controller 426 has outputs electrically connected to inputs of at least some of the emitters in the laser array 402. The controller is able to select particular individual or groups of lasers in the plurality of lasers to be energized, thus producing a particular laser FOV with a desired pattern of optical beams.

FIG. 4 also illustrates the fundamental operating principle of a LIDAR system 400 using relative motion of an array of laser emitters 402 and a lens system 404 that acts to both collimate the beam for each laser, and also to project each laser at a unique projection angle. In FIG. 4, a direction of relative motion between the laser array 402 and the lens system 404 that is orthogonal to the optical axis 414 of the lens system 404 is indicated by an arrow 406. The projection angle is defined by the distance from the optical axis of each laser. So, if the lens system 404 and the array 402 are moved relative to each other, the projection angle of each optical beam generated by a particular laser emitter will also correspondingly change. Thus, one feature of the present teaching is that relative motion of the lens system 404 and the laser array 402 can be used to change the angular resolution for any application, such as to cover gaps in the LIDAR system FOV. One skilled in the art will appreciate that the optical configuration shown in FIG. 4 is one particular example of the use of relative motion between a laser emitter or laser array and projection optics. The principle of relative motion is not constrained to any particular lens system. In particular, it should be understood that it is not necessary to move all of the lenses in the lens system to create a change in the projection angle for a particular laser. That is, some or all of the lenses in the lens system 404 may move. Also, the lens system 404 is not limited to a specific number of lenses.

One feature of the present teaching is that the relative motion of the lens system 404 and array 402 provides a particular pattern of optical beam FOVs that is known to the controller 426. This includes, for example, beam positions, beam size and/or beam overlap. As such, in some embodiments the relative motion combined with the controlling of the pattern of firing of lasers by controller 426 can be used to manage the power levels of the optical beams at a target range. Specifically, the firing pattern can be used to ensure that a predetermined optical power level is not exceeded in any individual optical beam FOVs. In some embodiments, the predetermined power level is a Class 1 eye safety limit. The firing pattern can also be controlled such that a predetermined optical power level is not exceeded in any overlapping optical beam FOVs.

The VCSEL devices described in connection with FIGS. 2A and 2B can be used with the LIDAR system 400 employing relative motion between the array of the laser emitters 402 and the lens system 404. Referring to FIGS. 2A-B and 4, the areas of the VCSEL die where no light emits, for example, regions 214, 264, could result in gaps in the field-of-view, if the divergence of the lasers is small enough so as to not result in overlap of the emitted optical beams in the far field. The relative motion of the array 402 and the lens system 404 described herein can be used to fill those gaps in the field-of-view.

Figure 5:
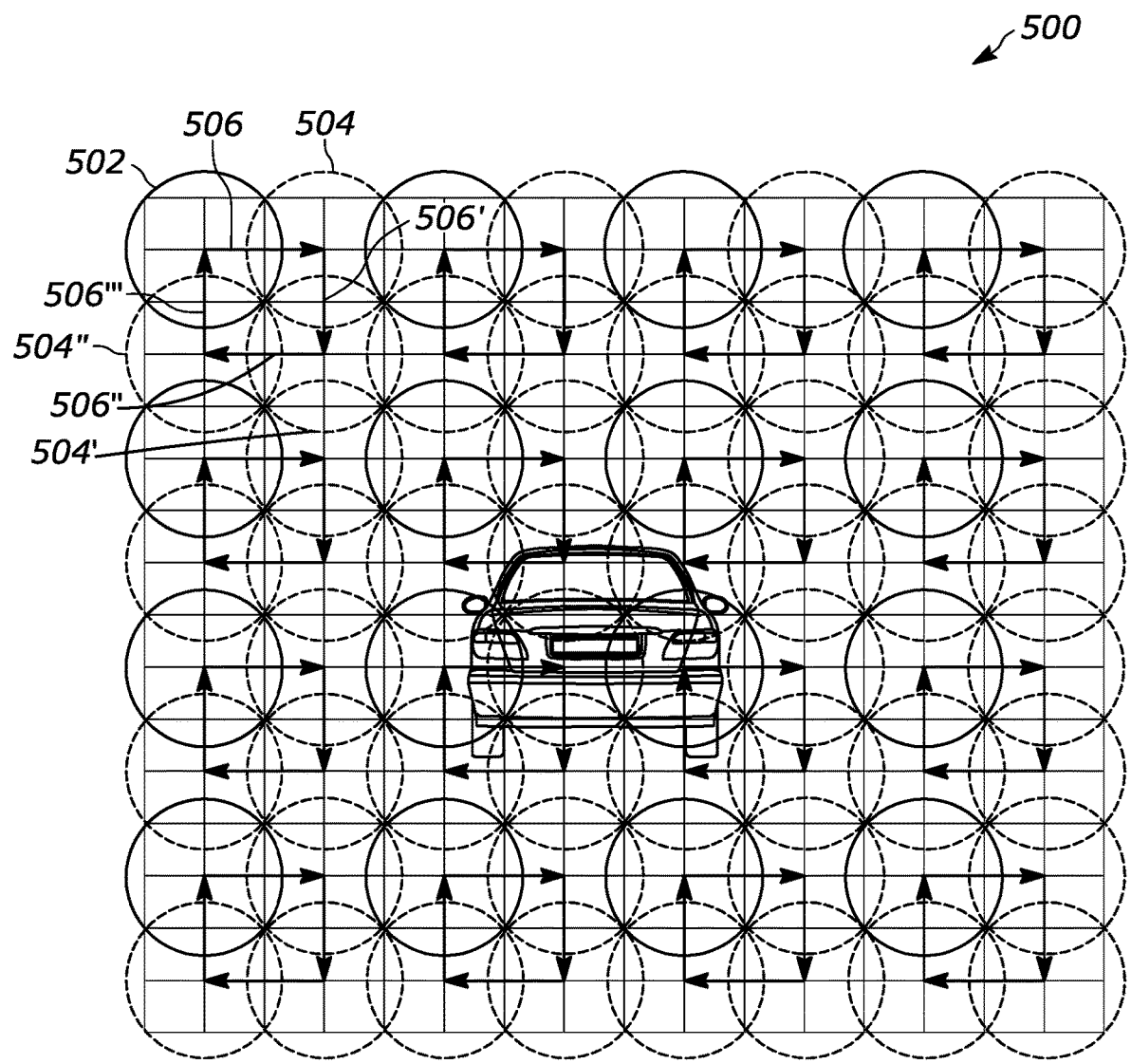
FIG. 5 illustrates a two-dimensional projection of the LIDAR system FOV of an embodiment of a LIDAR system according to the present teaching where the divergence of an individual laser emitter beam is the same as the system described in connection with FIG. 3A, and the relative motion of the lens system and the laser array is used to scan in a pattern as indicated.

FIG. 5 illustrates a two-dimensional projection of the LIDAR system FOV 500 of an embodiment of a LIDAR system of the present teaching where the divergence of an individual laser emitter beam is the same as the divergence for the 2D monolithic VCSEL array with 256 separate laser emitters described in connection with FIG. 2A and where relative motion of the lens system and laser array is used to scan in the indicated pattern. An emitter FOV pattern at an initial position is shown by the 4×4 array of solid-line circles

502. The next three positions move the emitter FOV in a square pattern with the moving emitter FOVs illustrated by dashed circles. Position two is shown as dashed circle 504. Position three is shown as dashed circle 504'. Position four is shown as dashed circle 504".

Referring to both FIGS. 4 and 5, the relative motion of the laser array 402 and the lens system 404 traverses the rectangular or square pattern illustrated by arrows 506, 506', 506", 506''' so that the moving FOVs cover the full LIDAR system FOV with only sixteen lasers in a 4×4 array configuration. Note that the relative motion illustrated in this embodiment is required in both the horizontal and the vertical directions. The necessary range of relative motion is equivalent to shifting the laser pattern by one half the pitch between any two optical beams generated by a laser emitter. For some embodiments, the actual relative motion required would be on the order of half the physical distance between emitters of the array, which might be a few hundred microns.

The relative motion between the laser array 402 and the lens system 404 can be accomplished through use of a flexure-based actuator 428. In various embodiments, actuator 428 comprises various known actuator technology. For example, actuators are commercially available from several vendors, including Physik Instrument in Germany. The force to drive the flexure-based actuator can be produced by various electromechanical devices including piezo motors or voice-coil actuators.

Figure 6A:
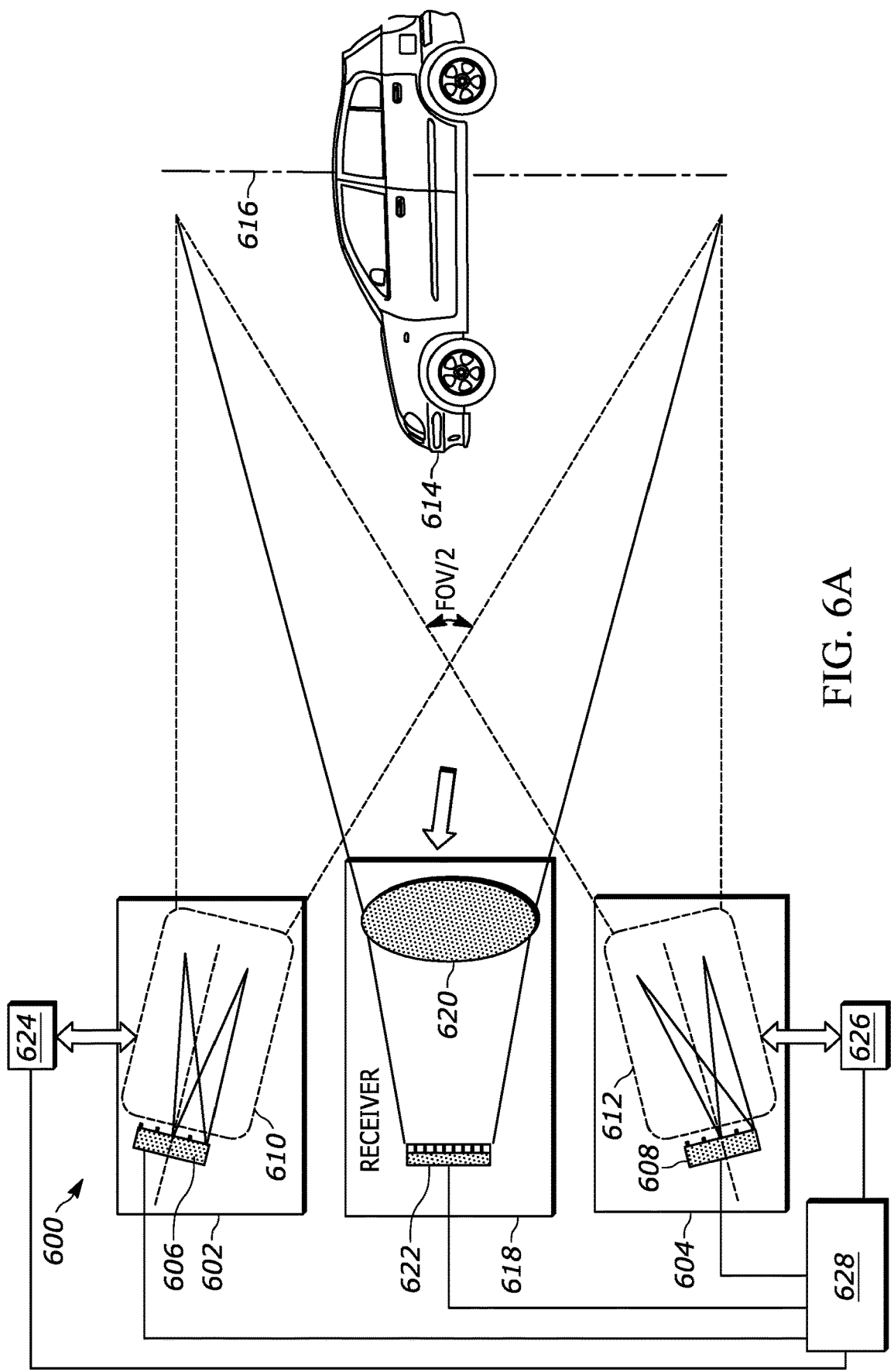
FIG. 6A illustrates an embodiment of a LIDAR system according to the present teaching that uses two physically separate transmitters.

FIG. 6A illustrates an embodiment of a LIDAR system 600 of the present teaching that uses two physically separate transmitters 602, 604. Each transmitter 602, 604 includes a VCSEL array 606, 608 with sixteen laser emitters. The two transmitters 602, 604 generate optical beams from laser arrays 606, 608 that are collimated and projected by lens systems 610, 612. The transmitters 602, 604 can generate light at different frequencies. In various embodiments, the lens systems 610, 612 can include one or more lenses and/or other optical elements (not shown). The optical beams from the two transmitters 602, 604 illuminate a target 614 at a target range 616, which in this illustration is an automobile.

The reflected light from both transmitters 602, 604 is combined at a single receiver 618. The receiver 618 includes a receive optical system 620 that can include one or more lens in various configurations. The receive optical system 620 can also include other optical elements, such as filters, mirrors, and numerous other optical elements. The receive optical system 620 also includes a detector array 622. The FOVs of both transmitters 602, 604 and the receiver 622 are largely overlapping.

A different relative position of the lens system 610 and the array 606 of the first transmitter 602 and different relative position of the lens system 612 and array 608 of the second transmitter 604 of FIG. 6A produce desirable and controllable positions of the emitter FOVs from the two transmitters 602, 604. These controllable positions are produced by an actuator 624, 626 that cause a relative motion between the arrays 606, 608 and the lens systems 610, 612. In particular, this configuration allows for a combination of relative motion changes between the laser arrays 606, 608 and their respective lens systems 610, 612 as described in connection with FIGS. 4 and 5 and emitter FOV interleaving to provide complete coverage across a desired FOV at one or more target ranges. In some embodiments, the interleaved emitter FOVs are generated by optical beams having different wavelengths.

A controller 628 is connected to the laser arrays 606, 608, the detector array 622 and to the actuators 624, 626. The controller 628 includes outputs electrically connected to inputs individual and/or groups of lasers in the laser arrays 606, 608 such that the controller is able to select particular individual or groups of lasers in arrays 606, 608 to be energized, thus producing a particular laser FOV with a desired pattern of optical beams. The controller 628 includes outputs electrically connected to least some of the detectors in the detector array 622. Thus, the controller can select particular detectors to be monitored. The controller 628 also includes connections to the actuators 624 so as to control the speed and/or throw and/or direction of the actuator to provide a desired speed and/or displacement and/or direction of the relative motion between the arrays 606, 608 and the lens systems 610, 612.

Figure 6B:
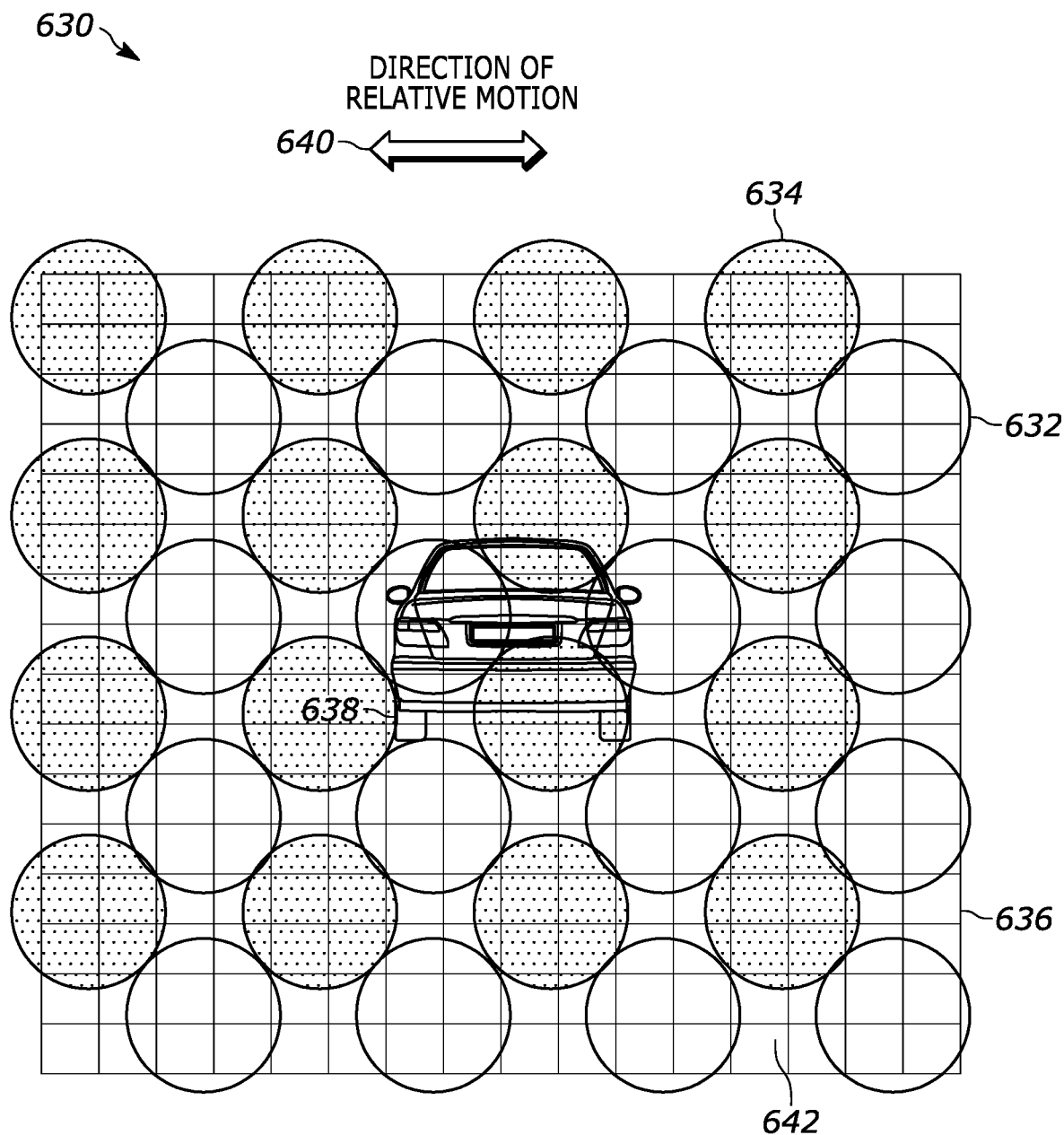
FIG. 6B illustrates a two-dimensional projection of the LIDAR system FOV of an embodiment of the LIDAR system of FIG. 6A in one relative position of the lens systems and arrays in the two transmitters.

FIG. 6B illustrates a two-dimensional projection of the LIDAR system FOV 630 of an embodiment of a LIDAR system of FIG. 6A in one relative position of the lens systems 610, 612 and laser arrays 606, 608 in the two transmitters. Referring to both FIGS. 6A-B, this LIDAR system FOV 630 includes emitter FOV for the first transmitter 602, represented by open circles 632, and emitter FOVs for the second transmitter 604, which are represented by different shaded circles 634. In some embodiments, the optical beam that generates the first FOV pattern, which is represented by the open circles 632, is one wavelength, and the optical beam that generates the second FOV pattern, which is represented by shaded circles 634, is a different wavelength.

The detector FOVs in the detector array 622 are illustrated as a 16×16 grid of squares 636. Also shown in the figure is the FOV 638 of the target, which is the automobile 614. The optical beams emitted from the two transmitters 602, 604 are interleaved in free space to produce the pattern of FOVs, which is the arrays of circles 632, 634 shown in FIG. 6B.

Figure 6C:
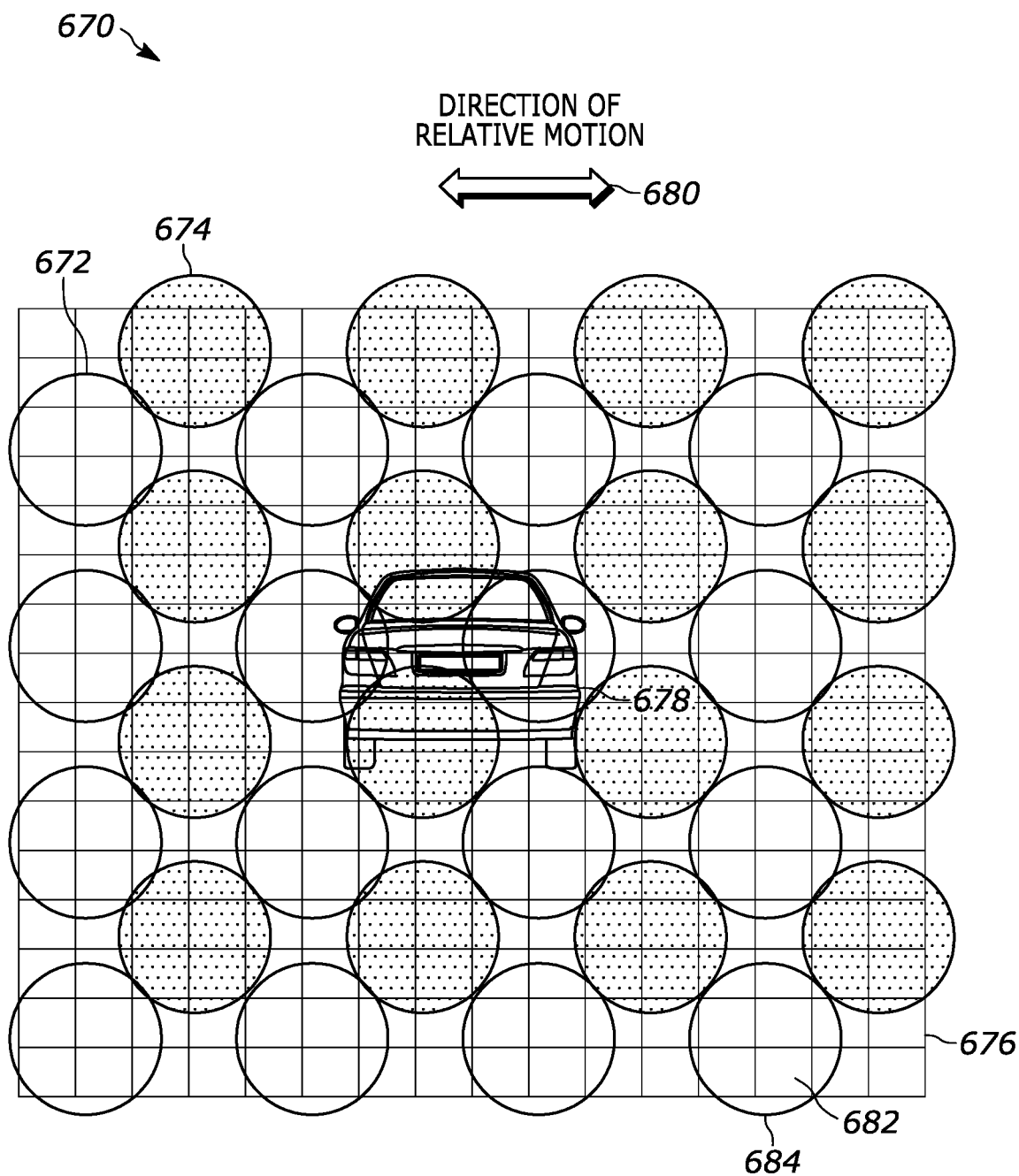
FIG. 6C illustrates a two-dimensional projection of the LIDAR system FOV of an embodiment of a LIDAR system of FIG. 6A in another relative position of the lens systems and arrays in the two transmitters.

FIG. 6C illustrates a two-dimensional projection of the LIDAR system FOV 670 of an embodiment of a LIDAR system of FIG. 6A in another relative position of the lens systems 610, 612 and laser arrays 606, 608 in the two transmitters 602, 604. Referring to all of FIGS. 6A-C, this LIDAR system FOV 670 includes emitter FOV for one transmitter 602, which is represented by open circles 672, and emitter FOVs for the second transmitter 604, which is represented by different shaded circles 674.

The detector FOVs in the detector array 622 are illustrated as a 16×16 grid of squares 676. Also shown is the FOV of the target, which is automobile 678. The optical beams emitted from the two transmitters 602, 604 are interleaved in free space to produce the pattern of FOVs, arrays of circles 672, 674 shown in FIG. 6C. A relative position within a direction of relative motion 640, 680 of each array 606, 608 with regard to its respective lens system 610, 612, is used to eliminate the gaps in the LIDAR system FOV that would otherwise be present if the position were static, i.e. operating only in the position of FIG. 6B or the position illustrated in FIG. 6C. For example, the FOV gap region 642 shown in FIG. 6B is in covered region 682 shown in FIG. 6C, as it is covered by the FOV of a laser emitter shown by circle 684.

The embodiment described in connection with FIGS. 6A-C is just one example of how relative motion (controlled relative positions) of a lens system and laser array, alone or combined with interleaving and/or use of different wavelength emitters, can produce desired FOV patterns that result in various performance improvements of a LIDAR system. It should be understood that there are numerous other combinations of optical free space interleaving with lens motion and or use of different optical wavelengths are possible within the scope of the present teaching.

Most known LIDAR systems use a mirror or motor to scan the FOV with a small number of lasers. The motion is continuous in some fashion. Continuation motion is accomplished by constantly sweeping the FOV in order to achieve a desired frame rate. Referring to FIGS. 6A-C, one aspect of the present teaching is the proper selection of the timing of the laser pulses, frame rate, and the timing and other aspects of the relative motion of the laser array and lens systems. In contrast to known systems, for the LIDAR system illustrated in FIGS. 6A-C, there is no motion of the lens system while the lasers corresponding to that lens system are pulsed, which allows for multiple pulses to be used for averaging/histogramming without significant temporal averaging.

An example of a method of operation according to the present teaching is as follows. Consider that the LIDAR system operates each laser individually, such that the thirty-two lasers in laser arrays 606, 608 of FIG. 6A are not fired at the same time. Also consider that multiple pulses are used for each laser in order to generate an average measurement with improved SNR, say for example sixty-four pulses can be used for each distance measurement. The time then that it takes to scan through each transmitter would be 16 lasers×64 pulses×T, where T is the pulse repetition rate dictated by the measurement range. For a 200-m range, T must be greater than 1.33 µsec. Then, for this example, the total time to generate a single frame with each transmitter is about 1.3 msec. If a frame is generated with each transmitter before switching to the next transmitter, and then back again, an acceptable mode of operation would be to take data with one transmitter with its lens system stationary while moving the lens system/lens array of the other transmitter. The time required to accomplish the motion without impacting system performance would then be less than 1.3 msec. A flexure-based actuator with a few hundred microns of travel typically has the capability of performing such step motion in the range of a few milliseconds, which is within the requirement.

Note that in a practical LIDAR system, the number of lasers in an array could be much higher, say two hundred fifty-six as shown in FIGS. 2A and 2B. Even with fewer averages, such as sixteen times, the time required to take a single frame with one transmitter is about 5.3 msec. In general, the actuator time will be on the order of a few msec. This timing will match a range of LIDAR configurations similar to that described in connection with FIG. 6A-C depending on the number of lasers per laser array, the number of pulses applied to each laser, the distance range, and the number of transmitters among other factors.

Figure 7:
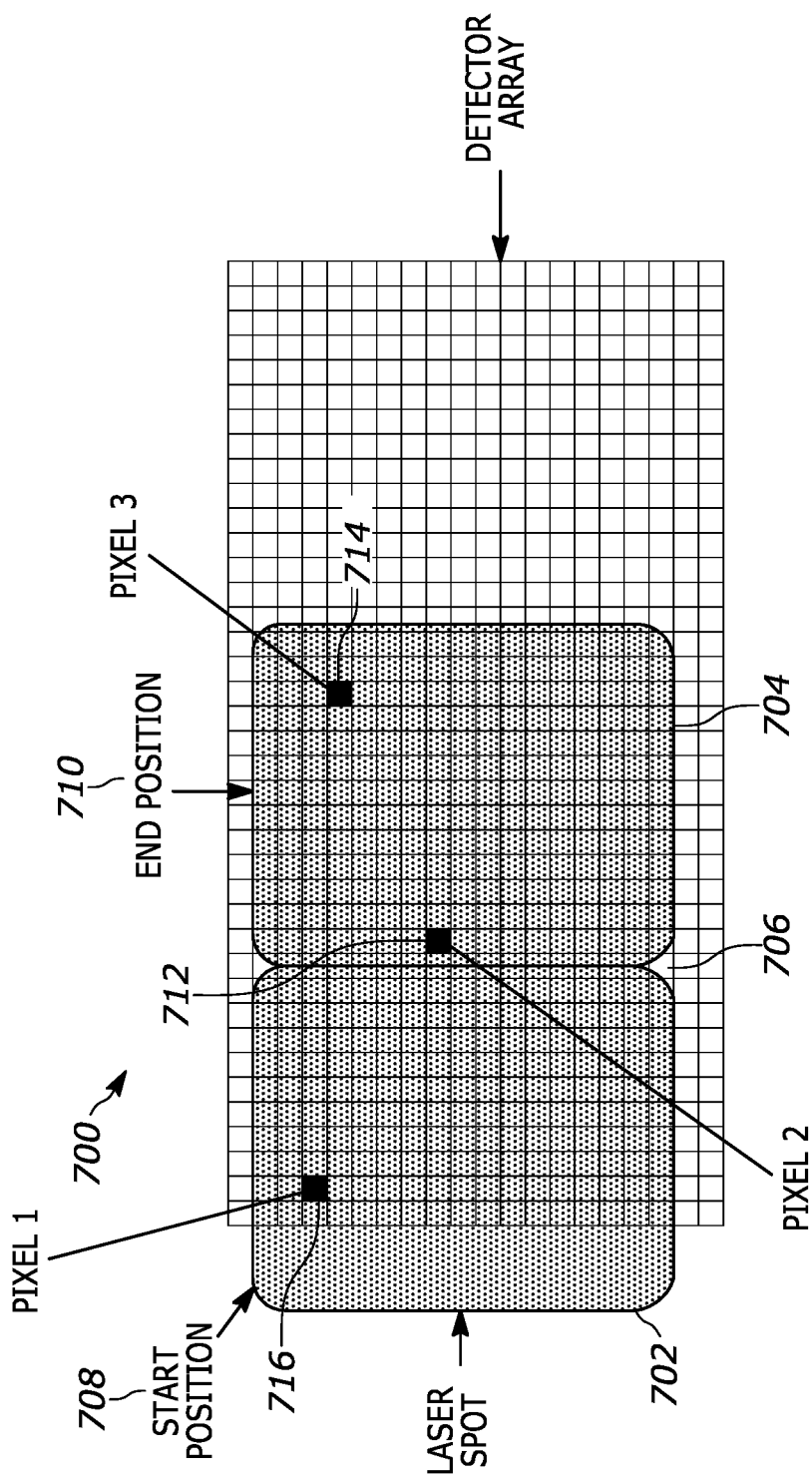
FIG. 7 illustrates a two-dimensional projection of the LIDAR system FOV of an embodiment of a LIDAR system according to the present teaching where the shape of the laser beam is nominally rectangular, and the FOV of a single pixel in the detector array is smaller than the laser beam.

FIG. 7 illustrates a two-dimensional projection of the LIDAR system FOV 700 of an embodiment of a LIDAR system of the present teaching where the shape of the optical beam FOV 702, 704 is nominally rectangular. The FOV of a single detector pixel is represented by small squares 706 such that the FOV of a single pixel in the detector array is smaller than the laser beam FOV 702, 704. In FIG. 7, a single laser beam FOV 702, 704 is generally rectangular in shape and when projected onto the detector array, overlaps many tens-of-pixels in the receiver detector array. In this case, the laser beam can be swept at a rate, such that multiple pulses can be taken with a single pixel without loss of a reflected pulse.

During motion of the laser beam, the laser optical beam FOV has a start position 708, and a non-overlapping end position 710. For example, Pixel 2 712 is located at the rightmost edge of Position 1, which is the start position 708 of the beam that corresponds to a particular offset between the laser array and the optical axis of the lens system. Pixel 2 712 is at the leftmost edge of Position 2, which is the end position 710 of the laser beam. This means that for the majority of the time, Pixel 2 receives some reflected light from the laser beam. Even if the laser beam is in motion, multiple measurements can be made from this pixel. This allows for sufficient time to obtain the required number of measurements. The relative motion in this case, will typically be larger than one half pitch of the laser beam pattern. Pixel 1 716 is located in the start position 708 for laser FOV 702. The configuration allows a particular pixel on the edge, such as Pixel 3 714, to be illuminated with more than one laser beam.

Figure 8:
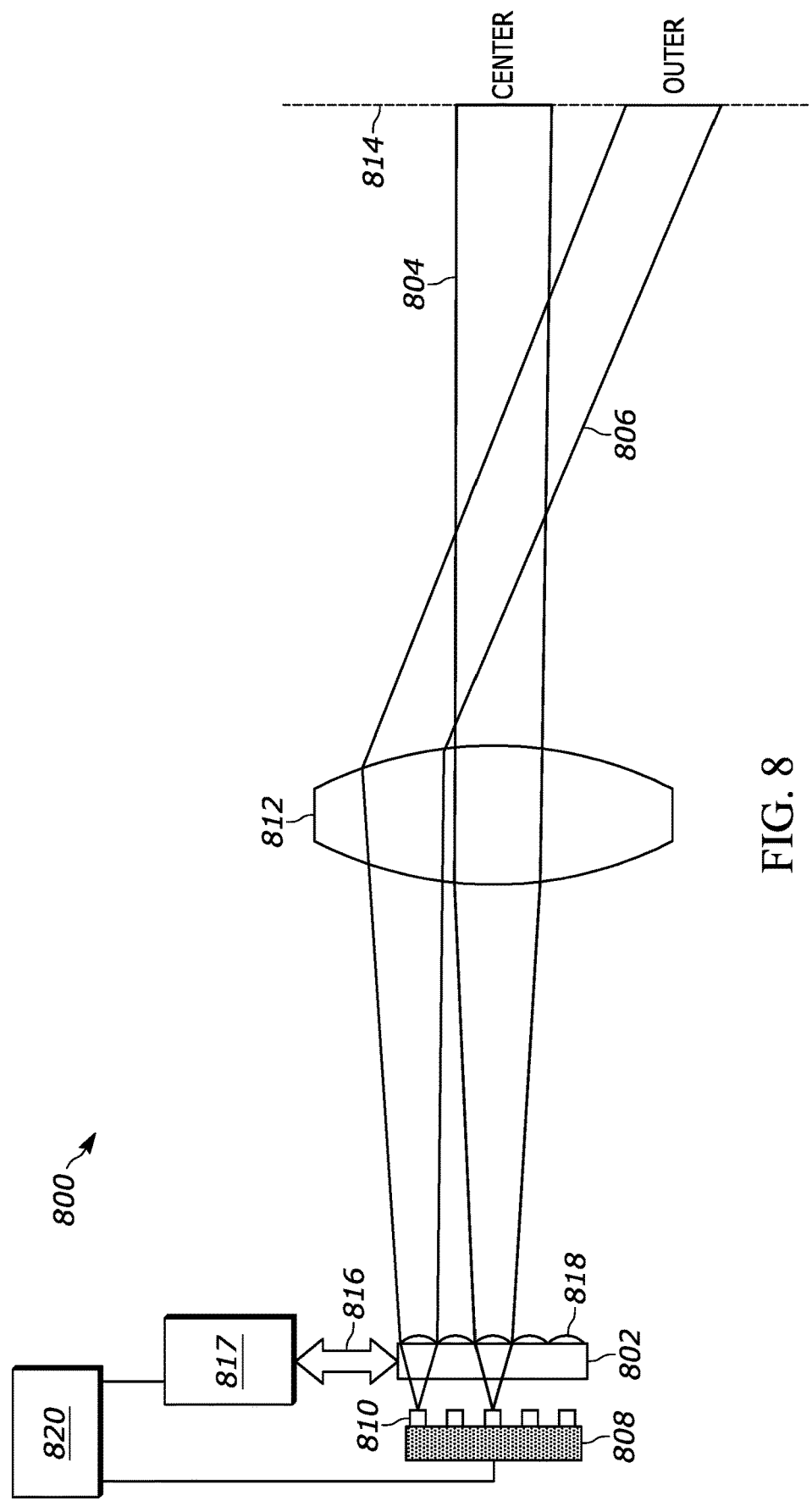
FIG. 8 illustrates an embodiment of a LIDAR system transmitter according to the present teaching where relative motion of a micro-lens array is used to change the projection angles of the laser beams.

FIG. 8 illustrates an embodiment of a LIDAR system transmitter 800 of the present teaching where relative motion of a micro-lens array 802 is used to change the projection angles of the laser beams 804, 806. An emitter array 808 generates optical beams, such as beams 804, 808, from each laser element 810 in the array 808. For example, in some embodiments, the emitter array 808 is a VCSEL array. Also, in some embodiments, the emitter array 808 is a one-dimensional array and in other embodiments, the emitter array 808 is a two-dimensional array. In some embodiments, the micro-lens array 802 is a one-dimensional array and in other embodiments, the micro-lens array 802 is a two-dimensional array. The optical beams, such as beams 804, 808, pass through the micro-lens array 802 and then pass through additional transmitter optics 812 to a target plane 814.

Relative motion between the micro-lens array 802 and the emitter array 808 is illustrated by arrow 816. This relative motion is cause by actuator 817. The relative motion illustrated by arrow 816 is shown in this embodiment as a vertical motion, but it should be understood that there can be relative motion in a variety of directions. The direction of the relative motion used depends on the desired relative positions of the optical beams, for example beams 804, 808, at the target plane 814. This relative motion illustrated by arrow 816 can be used to provide the desired FOV of the laser FOVs with respect to receive FOVs as described herein to meet various performance goals of a LIDAR system that comprises the LIDAR transmitter 800 using a micro-lens array 802.

A micro-lens array 802 has many small lenses 818 with at least one small lens 818 per individual laser beam 804, 806 emitted by the corresponding emitter array 808. The small lens 818 dimension is of the same order as the pitch of the emitter elements in the emitter array 808. This dimension is typically a few hundred microns. In the embodiment illustrated in FIG. 8, the transmitter optics 812 is shown as an additional large lens, which is fixed. The fixed transmitter optics 812 is also used to collimate the laser beams 804, 806, and so helps to determine the overall FOV of the transmitter 800. In the configuration shown in this embodiment, only the micro-lens array 802 is moved in order to further optimize the speed/response time of the system. The micro-lens array 802 can be moved quickly as it has a small mass. Also, small motions can generate large angular changes.

For example, a micro-lens array combined with the 2D VCSEL array as described herein might only need to move about ten microns to achieve the desired changes in projection angle. The micro-lens array 802 may be physically small, typically just slightly bigger than the VCSEL array which means its mass can be kept low, particularly if it is formed from plastic materials instead of glass. The small mass and small motion required, which can be on the order of about ten microns, reduces the requirements on the acceleration/force required and allows for short actuation times. In such embodiments, the lens array 802 can be displaced about ten microns in less than about 50 μsec, which can give additional system flexibility impacting scanning patterns and frame rates. A controller 820 connects to the actuator to provide control of the relative motion and to the laser array 808 to control the firing of particular individual or groups of lasers.

EQUIVALENTS

While the Applicant's teaching is described in conjunction with various embodiments, it is not intended that the Applicant's teaching be limited to such embodiments. On the contrary, the Applicant's teaching encompasses various alternatives, modifications, and equivalents, as will be appreciated by those of skill in the art, which may be made therein without departing from the spirit and scope of the teaching.

What is claimed is:

1. A Light Detection and Ranging (LIDAR) system comprising:
   a) a plurality of lasers, each of the plurality of lasers generating an optical beam having a Field of View (FOV) when energized such that firing the plurality of lasers at one time does not produce optical beams that cover a full LIDAR system FOV;
   b) a plurality of detectors formed in an array and positioned in an optical path of optical beams generated by the plurality of lasers, wherein FOV of one of the plurality of optical beams generated by the plurality of lasers and a FOV of another one of the plurality of optical beams generated by the plurality of lasers result in a gap between optical beams when imaged onto the plurality of detectors;
   c) a lens system positioned in the optical path of the optical beams generated by the plurality of lasers before the plurality of detectors, the lens system collimating and projecting the optical beams generated by the plurality of lasers;
   d) an actuator coupled to at least one of the plurality of lasers and the lens system, the actuator causing relative motion between the plurality of lasers and the lens system in a direction that is orthogonal to an optical axis of the lens system so as to cause relative motion between the FOVs of the optical beams generated by the plurality of lasers and the FOVs of the detectors; and
   e) a controller having an output connected to an input of the actuator and an output connected to an input of the plurality of lasers, the controller configured to control a firing pattern of the plurality of lasers and a relative motion of the actuator such that the firing pattern and the relative motion of the actuator produce optical beams that cover a full LIDAR system FOV.

2. The LIDAR system of claim 1 wherein at least some of the plurality of lasers are vertical cavity surface emitting lasers.

3. The LIDAR system of claim 1 wherein at least some of the plurality of lasers comprise two-dimensional monolithic vertical cavity surface emitting lasers.

4. The LIDAR system of claim 1 wherein the plurality of lasers is configured to maintain Class 1 eye safety in their respective FOV.

5. The LIDAR system of claim 1 wherein the controller is further configured to individually control lasers.

6. The LIDAR system of claim 1 wherein at least some of the plurality of detectors comprise Single Photon Avalanche Diode (SPAD) detectors.

7. The LIDAR system of claim 1 wherein at least some of the plurality of detectors comprise Silicon Photomultipliers (SiPM) detectors.

8. The LIDAR system of claim 1 wherein the actuator comprises a flexure-based actuator.

9. The LIDAR system of claim 1 wherein the actuator comprises a voice coil.

10. The LIDAR system of claim 1 wherein the actuator comprises a piezoelectric translator.

11. The LIDAR system of claim 1 wherein the actuator comprises an electromechanical device.

12. The LIDAR system of claim 1 wherein the actuator is configured to cause relative motion between the plurality of lasers and the lens system so that the plurality of optical beams move in a two-dimensional pattern.

13. The LIDAR system of claim 12 wherein the two-dimensional pattern comprises a rectangular pattern.

14. The LIDAR system of claim 1 wherein the actuator is configured so that relative motion between the FOVs of the optical beams generated by the plurality of lasers and the FOVs of the detectors changes an angular resolution of the LIDAR system.

15. The LIDAR system of claim 1 wherein the actuator is configured so that relative motion between the FOVs of the optical beams generated by the plurality of lasers and the FOVs of the detectors is substantially zero during a period a laser pulse is being transmitted.

16. The LIDAR system of claim 1 wherein the controller further comprises a plurality of inputs electrically connected to a plurality of outputs of at least some of the plurality of detectors, the controller being configured to select particular detectors to be monitored.

17. The LIDAR system of claim 1 wherein each of the plurality of lasers is configured so that each laser emitter in an array corresponds to a specific projection angle.

18. The LIDAR system of claim 1 wherein the plurality of detectors is configured so that a FOV of at least one of the plurality of optical beams generated by the plurality of lasers overlaps a FOV of at least two of the plurality of detectors.

19. The LIDAR system of claim 1 wherein the plurality of lasers comprises a laser array.

20. The LIDAR system of claim 19 wherein the FOV of one of the plurality of optical beams generated by the plurality of lasers and the FOV of another one of the plurality of optical beams generated by the plurality of lasers result in the gap between optical beams when imaged onto the plurality of detectors produces an array of optical beams imaged onto the plurality of detectors.

21. The LIDAR system of claim 20 wherein a range of the relative motion is nominally equivalent to shifting the FOV of one of the plurality of optical beams generated by the plurality of lasers by one half the pitch between any two optical beams.

22. The LIDAR system of claim 20 wherein the relative motion between the FOVs of the optical beams generated by the plurality of lasers and the FOVs of the detectors traverses a rectangular pattern.

23. The LIDAR system of claim 1 wherein the controller is further configured to control the firing pattern of the plurality of lasers and the relative motion of the actuator such that the firing pattern and the relative motion of the actuator do not cause motion of an optical beam produced during a laser pulse.

24. A method of Light Detection and Ranging (LIDAR), the method comprising:
   a) energizing selected ones of a plurality of lasers so that each of the selected ones of the plurality of lasers generates an optical beam having a Field-of-View (FOV), and such that firing the plurality of lasers at one time does not produce optical beams that cover a full LIDAR system FOV;
   b) collimating and projecting the optical beams generated by the selected ones of the plurality of lasers with a lens system onto a plurality of detectors, wherein a FOV of one of the plurality of optical beams generated by the plurality of lasers and a FOV of another one of the plurality of optical beams generated by the plurality of lasers result in a gap between optical beams when imaged onto the plurality of detectors;
   c) moving the plurality of lasers relative to the lens system, thereby causing relative motion between the FOVs of the optical beams generated by the plurality of lasers and the FOVs of the plurality of detectors;
   d) controlling a firing pattern of the plurality of lasers and the moving the plurality of lasers relative to the lens system such that the firing pattern and the moving the plurality of lasers relative to the lens system produce optical beams that cover a full LIDAR system FOV; and
   e) monitoring selected ones of the plurality of detectors within the FOV of at least one of the plurality of optical beams generated by the selected ones of the plurality of lasers.

25. The method of claim 24 wherein the energizing selected ones of the plurality of lasers comprises firing a pattern of lasers such that a predetermined optical power level is not exceeded in any individual optical beam FOVs.

26. The method of claim 24 wherein the energizing selected ones of the plurality of lasers comprises firing a pattern of lasers such that Class 1 eye safety limit is not exceeded in any individual optical beam FOVs.

27. The method of claim 24 wherein the energizing selected ones of the plurality of lasers comprises firing a pattern of lasers such that a predetermined optical power level is not exceeded in any overlapping optical beam FOVs.

28. The method of claim 24 wherein the energizing selected ones of the plurality of lasers comprises firing a pattern of lasers such that Class 1 eye safety limit is not exceeded in any overlapping optical beam FOVs.

29. The method of claim 24 wherein the relative motion between the plurality of lasers and the lens system is in a direction that is orthogonal to an optical axis of the lens system.

30. The method of claim 24 wherein the relative motion is about half a physical distance between emitters of at least some of the plurality of lasers.

31. The method of claim 24 wherein no relative motion of the plurality of lasers and the lens system occurs during a time a laser pulse is transmitted.

32. The LIDAR system of claim 24 further comprising controlling the firing pattern of the plurality of lasers and the moving the plurality of lasers relative to the lens system such that the firing pattern and the moving the plurality of lasers relative to the lens system produce optical beams that do not move during a laser pulse.

* * * * *